United States Patent
Kawakami et al.

(10) Patent No.: US 11,090,577 B2
(45) Date of Patent: Aug. 17, 2021

(54) PURIFICATION METHOD AND PURIFICATION APPARATUS

(71) Applicant: Semiconductor Energy Laboratory Co., Ltd., Kanagawa-ken (JP)

(72) Inventors: Sachiko Kawakami, Kanagawa (JP); Yasushi Kitano, Kanagawa (JP); Kanata Abe, Kanagawa (JP)

(73) Assignee: Semiconductor Energy Laboratory Co., Ltd.

( * ) Notice: Subject to any disclaimer, the term of this patent is extended or adjusted under 35 U.S.C. 154(b) by 122 days.

(21) Appl. No.: 16/090,914

(22) PCT Filed: Mar. 30, 2017

(86) PCT No.: PCT/IB2017/051809
§ 371 (c)(1),
(2) Date: Oct. 3, 2018

(87) PCT Pub. No.: WO2017/175096
PCT Pub. Date: Oct. 12, 2017

(65) Prior Publication Data
US 2019/0118113 A1    Apr. 25, 2019

(30) Foreign Application Priority Data

Apr. 8, 2016  (JP) ............................. JP2016-077764

(51) Int. Cl.
| | | |
|---|---|---|
| *B01D 7/02* | (2006.01) | |
| *B01D 7/00* | (2006.01) | |
| *B01D 1/14* | (2006.01) | |
| *C07B 63/00* | (2006.01) | |
| *C09K 11/06* | (2006.01) | |
| *H01L 51/00* | (2006.01) | |
| *H01L 51/50* | (2006.01) | |
| *H01L 51/56* | (2006.01) | |
| *H01L 51/52* | (2006.01) | |

(52) U.S. Cl.
CPC ............... *B01D 7/02* (2013.01); *B01D 1/14* (2013.01); *B01D 7/00* (2013.01); *C07B 63/00* (2013.01); *C09K 11/06* (2013.01); *H01L 51/0025* (2013.01); *H01L 51/5012* (2013.01); *H01L 51/5064* (2013.01); *H01L 51/56* (2013.01); *H01L 51/5278* (2013.01)

(58) Field of Classification Search
CPC .................... B01D 7/00; B01D 7/02
See application file for complete search history.

(56) References Cited

U.S. PATENT DOCUMENTS

| | | | | |
|---|---|---|---|---|
| 3,840,349 | A * | 10/1974 | McGhie | .................. B01D 7/00 422/244 |
| 6,878,183 | B2 | 4/2005 | Soeda et al. | |
| 9,951,398 | B2 * | 4/2018 | Auxier, II | ............... C22B 59/00 |
| 2014/0191422 | A1 | 7/2014 | Dai et al. | |

FOREIGN PATENT DOCUMENTS

| | | |
|---|---|---|
| CN | 001419466 A | 5/2003 |
| CN | 001535749 A | 10/2004 |
| CN | 201664523 U | 12/2010 |
| CN | 102924207 A | 2/2013 |
| CN | 104857736 A | 8/2015 |
| CN | 104926571 A | 9/2015 |
| EP | 1 273 330 A1 | 1/2003 |
| JP | 11-267401 A | 10/1999 |
| JP | 2003-088704 | 3/2003 |
| JP | 2005-313069 A | 11/2005 |
| JP | 2014-008483 A | 1/2014 |
| JP | 2015-160182 A | 9/2015 |
| KR | 2014-0032493 A | 3/2014 |
| TW | 201306929 | 2/2013 |
| WO | WO 2013/023533 A1 | 2/2013 |

OTHER PUBLICATIONS

International Search Report re Application No. PCT/IB2017/051809, dated Jul. 11, 2017.
Written Opinion re Application No. PCT/IB2017/051809, dated Jul. 11, 2017.
Chinese Office Action (Application No. 201780021917.1) dated Sep. 25, 2020.

* cited by examiner

*Primary Examiner* — Stuart L Hendrickson
(74) *Attorney, Agent, or Firm* — Husch Blackwell LLP

(57) ABSTRACT

A novel sublimation purification method is provided. Moreover, a novel sublimation purification apparatus is provided. A purification method using a purification apparatus including a purification portion where a substance is purified by vaporization, a temperature adjustment means, a gas supply means, and a gas discharge means is provided. In the purification method, the inside of the purification portion is made to have a first pressure with use of the gas discharge means, a temperature gradient is generated in the purification portion with use of the temperature adjustment means such that the substance is purified, the pressure in the purification portion is then set at a second pressure with use of the gas supply means, and the purification portion is cooled with use of the temperature adjustment means. The second pressure is higher than the first pressure and the second pressure is higher than or equal to an atmospheric pressure.

6 Claims, 10 Drawing Sheets

PURIFICATION METHOD AND PURIFICATION APPARATUS

TECHNICAL FIELD

One embodiment of the present invention relates to a purification method and a purification apparatus of sublimation, distillation, or the like for purifying and collecting a substance, and particularly relates to a method and an apparatus for purifying a substance by vaporization.

Moreover, one embodiment of the present invention relates to a manufacturing method of a light-emitting element or a semiconductor element using the purification method. Alternatively, one embodiment of the present invention relates to a manufacturing method of a display device, an electronic device, and a lighting device including the light-emitting element or the semiconductor element.

Note that one embodiment of the present invention is not limited to the above technical field. The technical field of one embodiment of the invention disclosed in this specification and the like relates to an object, a method, or a manufacturing method. Alternatively, one embodiment of the present invention relates to a process, a machine, manufacture, or a composition (composition of matter). Thus, more specifically, as the technical field of one embodiment of the present invention disclosed in this specification, a semiconductor device, a display device, a liquid crystal display device, a light-emitting device, a lighting device, a power storage device, a memory device, a driving method thereof, or a manufacturing method thereof can be given as an example.

BACKGROUND ART

In recent years, research and development has been actively conducted on light-emitting elements using electroluminescence (Electroluminescence: EL). A basic structure of these light-emitting elements is a structure in which a layer containing a substance having a light-emitting property (an EL layer) is interposed between a pair of electrodes. By application of a voltage between the electrodes of this element, light emission from the substance having a light-emitting property can be obtained.

Since the above-described light-emitting element is of a self-luminous type, a display device using this has advantages such as excellent visibility, no necessity of a backlight, low power consumption, and the like. Furthermore, the display device also has advantages in that it can be fabricated to be thin and lightweight, and has a high response speed, for example.

In a light-emitting element (e.g., an organic EL element) in which an organic compound is used as the substance having a light-emitting property and an EL layer containing the organic compound having a light-emitting property is provided between a pair of electrodes, application of a voltage between the pair of electrodes causes injection of electrons from a cathode and holes (holes) from an anode into the EL layer having a light-emitting property and thus a current flows. Then, by recombination of the injected electrons and holes, the organic compound having a light-emitting property is brought into an excited state, and light emission can be obtained from the excited organic compound having a light-emitting property.

Emission efficiency and lifetime are important characteristics of such light-emitting elements; however, it is known that performances such as emission efficiency and lifetime of light-emitting elements do not depend only on the characteristics of substances used for the light-emitting elements and the performances of the light-emitting elements are significantly affected by the purity of the substances. For this reason, substances with a high purity are needed, and in particular, a sublimation purification method is used as a method of increasing the purity of organic compounds (see Patent Document 1, for example).

PRIOR ART DOCUMENT

Patent Document

[Patent Document 1] Japanese Published Patent Application No. 2003-88704

SUMMARY OF THE INVENTION

Problems to be Solved by the Invention

When a substance is purified by being vaporized, there are a case where the substance sublimes from a solid into a gas and a case where the substance evaporates into a gas after a solid melts into a liquid. In the former case, the purified substance sublimes from a gas into a solid, and in the latter case, the purified substance condenses from a gas into a liquid and then solidifies from the liquid into a solid. In the case where the volume of the substance is significantly changed when the purified substance is collected, the change in volume is accompanied by a problem of scattering of the substance, a problem of breakage of part of a purification apparatus, and the like in some cases. Note that an increase in the size of a purification apparatus is effective in increasing productivity but the increase in the size of a purification apparatus renders the problems more noticeable.

If part of a purification apparatus is broken, not only is the repair of the purification apparatus or the replacement of components needed, there is also a problem of a reduction in the collection amount of the substance due to dispersion of the substance purified to be collected or a problem of a reduction in the purity of the substance due to entry of impurities following the breakage of the purification apparatus.

In view of the above, an object of one embodiment of the present invention is to provide a novel purification method. Alternatively, an object of one embodiment of the present invention is to provide a novel purification apparatus. Alternatively, an object of one embodiment of the present invention is to provide a novel purification method or purification apparatus with which a substance is purified with a high purity. Alternatively, an object of one embodiment of the present invention is to provide a novel purification method or purification apparatus with which a substance is purified in a high yield. Alternatively, an object of one embodiment of the present invention is to provide a manufacturing method of a light-emitting element or a semiconductor element using a novel purification method.

Note that the description of the above objects does not disturb the existence of other objects. Note that one embodiment of the present invention does not need to achieve all the objects. Objects other than the above are naturally apparent from the description of the specification and the like and the objects other than the above can be derived from the description of the specification and the like.

Means for Solving the Problems

One embodiment of the present invention is a purification method using a purification apparatus including a purification portion where a substance is purified by vaporization, a temperature adjustment means provided in the purification portion, a gas supply means that is provided at one end portion of the purification portion and has a function of supplying a gas into the purification portion, and a gas discharge means that is provided at the other end portion of the purification portion and has a function of discharging a gas from the purification portion. In the purification method, the purification portion is made to have a first pressure with use of the gas discharge means; after a temperature gradient is generated in the purification portion with use of the temperature adjustment means and the substance is purified, the pressure in the purification portion is made to become a second pressure with use of the gas supply means; the purification portion is cooled with use of the temperature adjustment means; the second pressure is higher than the first pressure; and the second pressure is higher than or equal to an atmospheric pressure.

In the above method, the first pressure is preferably lower than or equal to 10 Pa. Moreover, the first pressure is preferably higher than or equal to 0.1 Pa.

Moreover, in each of the above methods, the purification portion is preferably heated so that the temperature of part of the inside of the purification portion becomes higher than or equal to 150° C. and lower than or equal to 500° C.

Moreover, in each of the above methods, the gas is preferably discharged from the purification portion to provide the first pressure. Moreover, the gas is preferably supplied to the purification portion to provide the second pressure.

Moreover, another embodiment of the present invention is a purification apparatus including a purification portion where a substance is purified by vaporization, a temperature adjustment means provided in the purification portion, a gas supply means that is provided at one end portion of the purification portion and has a function of supplying a gas into the purification portion, a gas discharge means that is provided at the other end portion of the purification portion and has a function of discharging a gas from the purification portion, and a control system. In the purification apparatus, the control system has a function of controlling the gas supply means, the gas discharge means, and the temperature adjustment means. The control system has a function of controlling the gas discharge means so that the purification portion is made to have a first pressure. The control system has a function of controlling the temperature adjustment so that a temperature gradient is generated in the purification portion. The control system has a function of controlling the gas supply means so that the pressure in the purification portion becomes a second pressure after the substance is purified. The control system has a function of controlling the temperature adjustment so that the purification portion is cooled. The second pressure is higher than the first pressure, and the second pressure is higher than or equal to an atmospheric pressure.

In the above structure, the first pressure is preferably lower than or equal to 10 Pa. Moreover, the first pressure is preferably higher than or equal to 0.1 Pa.

Moreover, in each of the above structures, the purification portion is preferably heated so that the temperature of part of the inside of the purification portion becomes higher than or equal to 150° C. and lower than or equal to 500° C.

Moreover, in each of the above structures, the gas is preferably discharged from the purification portion to provide the first pressure. Moreover, the gas is preferably supplied to the purification portion to provide the second pressure.

Moreover, in each of the above structures, the pressure higher than or equal to the atmospheric pressure is preferably a pressure higher than or equal to $9.0\times10^4$ Pa and lower than or equal to $1.5\times10^5$ Pa.

Moreover, in each of the above structures, the gas supplied to the purification apparatus preferably includes an inert gas. Moreover, the inert gas preferably includes argon or nitrogen. Moreover, the inert gas preferably has a purity higher than or equal to 99.999 volume %.

Moreover, in each of the above structures, preferably, the purification apparatus includes a purification tube in the purification portion and the purification tube has a thickness of 4 mm or more or a thickness that is 2% or more of the tube outside diameter of the purification tube. Moreover, for the purification tube, glass or quartz is preferably used.

Moreover, another embodiment of the present invention is a manufacturing method of a light-emitting element or a semiconductor element using the purification method. Moreover, another embodiment of the present invention is a manufacturing method of a display device including the light-emitting element or the semiconductor element. Moreover, another embodiment of the present invention is a manufacturing method of an electronic device including the display device. Moreover, another embodiment of the present invention is a manufacturing method of a lighting device including the light-emitting element. Moreover, the category of one embodiment of the present invention includes not only a manufacturing method of a light-emitting device including a light-emitting element but also a manufacturing method of an electronic device including a light-emitting device. Therefore, the light-emitting device in this specification refers to an image display device or a light source (including a lighting device). Moreover, the light-emitting device is sometimes included in a display module in which a connector such as an FPC (Flexible Printed Circuit) or a TCP (Tape Carrier Package) is connected to a light-emitting element, a display module in which a printed wiring board is provided on the tip of a TCP, or a display module in which an IC (integrated circuit) is directly mounted on a light-emitting element by a COG (Chip On Glass) method.

Effect of the Invention

According to one embodiment of the present invention, a novel purification method can be provided. Alternatively, according to one embodiment of the present invention, a novel purification apparatus can be provided. Alternatively, according to one embodiment of the present invention, a novel purification method or purification apparatus with which a substance is purified with a high purity can be provided. Alternatively, according to one embodiment of the present invention, a novel purification method or purification apparatus with which a substance is purified in a high yield can be provided. Alternatively, according to one embodiment of the present invention, a manufacturing method of a light-emitting element or a semiconductor element using the novel purification method or purification apparatus can be provided.

Note that the description of these effects does not disturb the existence of other effects. Note that one embodiment of the present invention does not need to have all the effects. Effects other than these are naturally apparent from the description of the specification, the drawings, the claims, and the like and the effects other than these can be derived from the description of the specification, the drawings, the claims, and the like.

MODE FOR CARRYING OUT THE INVENTION

Figure 1:
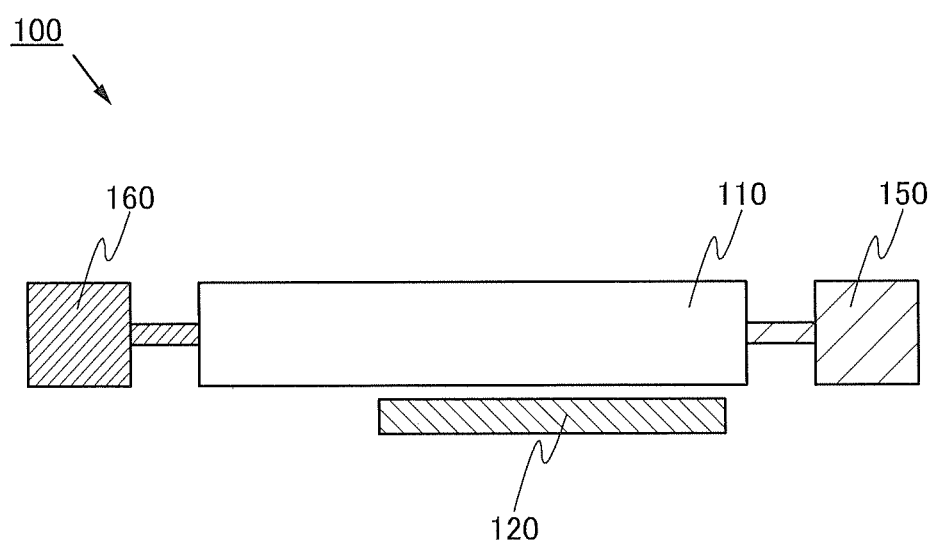
FIG. 1 A schematic view illustrating a purification apparatus of one embodiment of the present invention.

Embodiments of the present invention are described in detail below using the drawings. Note that the present invention is not limited to description below, and modes and details thereof can be variously modified without departing from the purpose and the scope of the present invention. Thus, the present invention should not be interpreted as being limited to the description of the embodiments described below.

Note that the position, the size, the range, or the like of each structure shown in drawings and the like does not represent the actual position, size, range, or the like in some cases for easy understanding. Therefore, the disclosed invention is not necessarily limited to the position, the size, the range, or the like disclosed in the drawings and the like.

The ordinal numbers such as first and second in this specification and the like are used for convenience and do not denote the order of steps or the stacking order of layers in some cases. Therefore, for example, description can be made even when "first" is replaced with "second", "third", or the like as appropriate. In addition, the ordinal numbers in this specification and the like are not necessarily the same as those which specify one embodiment of the present invention.

In describing structures of the invention using the drawings in this specification and the like, common numerals are used for the same in different drawings in some cases.

In this specification and the like, the terms "film" and "layer" can be interchanged with each other. For example, the term "conductive layer" can be changed into the term "conductive film" in some cases. Alternatively, for example, the term "insulating film" can be changed into the term "insulating layer" in some cases.

Moreover, in this specification and the like, a fluorescent compound refers to a compound that emits light in the visible light region when the relaxation from the singlet excited state to the ground state occurs. Moreover, a phosphorescent compound refers to a compound that emits light in the visible light region at normal temperature when the relaxation from the triplet excited state to the ground state occurs. That is, a phosphorescent compound is one of the compounds that can convert triplet excitation energy into visible light.

Moreover, substances purified in one embodiment of the present invention are not limited to organic compounds and include, in the category, any substance that can be purified by vaporization. Moreover, in this specification and the like, purification uses changes in three states of a substance and includes, in its category, distillation in addition to sublimation purification. In other words, the purification includes, in addition to purification using a phenomenon in which a substance that is a solid at normal temperatures and normal pressures directly becomes the gas without undergoing a liquid and the inverse phenomenon in which a gas directly becomes the solid without undergoing a liquid, purification using a phenomenon in which a substance that is a solid at normal temperatures and normal pressures undergoes a liquid to become a gas and the inverse phenomenon in which a gas undergoes a liquid to become a solid. Thus, the intended substance includes not only a substance that sublimes or solidifies as a solid but also a substance that condenses as a liquid. Moreover, sublimation or solidification as a solid is referred to as deposition in this specification and the like in some cases.

Embodiment 1

In this embodiment, a purification method and a purification apparatus of one embodiment of the present invention are described below.

<Purification Apparatus>

FIG. 1 is a schematic view illustrating a purification apparatus 100 of one embodiment of the present invention.

The purification apparatus 100 of one embodiment of the present invention includes a purification portion 110 for purifying and collecting the intended substance by vaporizing a sample and a temperature adjustment means 120 for vaporizing and purifying the sample. Moreover, the purification apparatus 100 includes a gas supply means 150 provided close to one end portion of the purification portion and a gas discharge means 160 provided close to the other end portion of the purification portion 110. Note that in this specification and the like, the sample indicates a material in which the intended substance, impurities, a solvent, and the like are mixed.

The temperature adjustment means 120 is provided in contact with or close to the purification portion 110 and the temperature adjustment means 120 has a function of generating a temperature gradient in the purification portion 110. Specifically, the temperature adjustment means 120 has a function of generating a temperature gradient in the purification portion 110, such as a temperature range in which the sample vaporizes and a temperature range in which the intended substance deposits, condenses, or sublimes, so that the intended substance can be at least isolated, purified, and collected. The temperature gradient may be set such that the temperature is high at one end portion of the purification portion 110 and the temperature is low at the other end portion or that the temperature is high at the middle of the purification portion 110 and the temperature is low at both ends.

The sample vaporized in the purification portion 110 is diffused to a region at a lower vapor pressure. The vapor pressure generally increases with a rise in temperature. Therefore, according to the temperature gradient, the vaporized sample is diffused to a region at a lower temperature. In other words, according to the pressure and temperature gradient in the purification portion 110, the vaporized sample condenses as a liquid or sublimes as a solid in a temperature range where a state change to a liquid or a solid is caused. Note that the temperature range where the sample vaporizes is the range where the temperature in the purification portion 110 is the highest.

The purification portion 110 preferably has a tubular shape, and metal, glass, and the like can be used for the purification portion 110.

As the temperature adjustment means 120, a heating means such as a heater or a hotplate is used, and a structure in which it is provided at least in the vicinity of a region where the sample vaporizes is preferred. Note that although an example of the case where one temperature adjustment means 120 is provided close to the purification portion 110 in the purification apparatus 100 in FIG. 1 is shown, one embodiment of the present invention is not limited to this, and the case where two or more temperature adjustment means 120 are provided is possible. The installation position or number of the temperature adjustment means 120 can be changed as appropriate. Moreover, the purification portion 110 may be enclosed by a heat insulation means such as a cover using metal, glass wool, and the like, for example, so that the state of the temperature gradient generated in the purification portion 110 can be maintained.

Note that when the temperature of the purification portion 110 is adjusted, the temperature gradient in the purification portion 110 is preferably set in accordance with the temperature at which the sample vaporizes, the temperature at which the intended substance condenses or sublimes, and the like. Thus, the sample including impurities and the like, which vaporize in the purification portion 110 having the temperature gradient, can be separated into the intended substance and the impurities and the like (having a condensation or sublimation temperature and a weight, which are different from those of the intended substance), whereby the purity of the intended substance can be increased. The temperature range in which the sample vaporizes is preferably between the temperature at which the substance vaporizes and the temperature at which the substance decomposes, inclusive. For example, in the case where an organic compound is used as the intended substance, the temperature range is preferably between normal temperature and 500° C., inclusive, more preferably between 150° C. and 500° C., inclusive.

The gas supply means 150 is provided close to one end portion of the purification portion 110 and has a function of supplying a gas into the purification portion 110, and the gas discharge means 160 is provided close to the other end portion of the purification portion 110 and has a function of discharging a gas from the purification portion 110. The pressure in the purification portion 110 can be increased by the supply of a gas into the purification portion 110 with the use of the gas supply means 150. Moreover, the pressure in the purification portion 110 can be decreased by the discharge of a gas from the purified portion 110 with the use of the gas discharge means 160.

A gas is preferably supplied as a carrier gas from the gas supply means 150 into the purification portion 110 while the sample is purified because the vaporized sample can be diffused smoothly into the purification portion 110 and the intended substance can be condensed or sublimed efficiently. Moreover, at this time, the sample to be purified is placed in the vicinity of one end portion of the purification portion 110 to which the gas supply means 150 is close, and the temperature gradient is set by the temperature adjustment means 120 such that the temperature of the region is high and the temperature is decreased toward the other end portion to which the gas discharge means 160 is close.

Moreover, the purification of the sample is preferably performed under reduced pressure, and specifically, the pressure in the purification portion 110 is preferably 10 Pa or lower. The reduction in the pressure in the purification portion 110 can lower the temperature at which the sample vaporizes, which can reduce thermal decomposition of the intended substance. The pressure in the purification portion 110 can be controlled by the gas discharge means 160 and the gas supply means 150 included in the purification apparatus. Moreover, the gas discharge means 160 may have a cock or a valve between itself and the purification portion 110. The flow rate of the gas discharged from the purification portion 110 can be controlled with the cock or the valve. Moreover, the gas supply means 150 may have a cock or a valve between itself and the purification portion 110. The flow rate of the gas supplied to the purification portion 110 can be controlled with the cock or the valve.

As the gas supplied into the purification portion 110 by the gas supply means 150, an inert gas is preferably used to inhibit a reaction such as oxidation or decomposition of the intended substance; specifically, nitrogen, argon, helium, neon, krypton, xenon, and the like are preferably used. Moreover, the purity of the inert gas is preferably higher than or equal to 99.999 volume %.

Moreover, as the gas discharge means 160, a vacuum pump, specifically, a rotary pump, a dry pump, a diffusion pump, a turbo molecular pump, and the like can be used, and a dry pump and a turbo molecular pump are preferred among them.

Figure 2A:
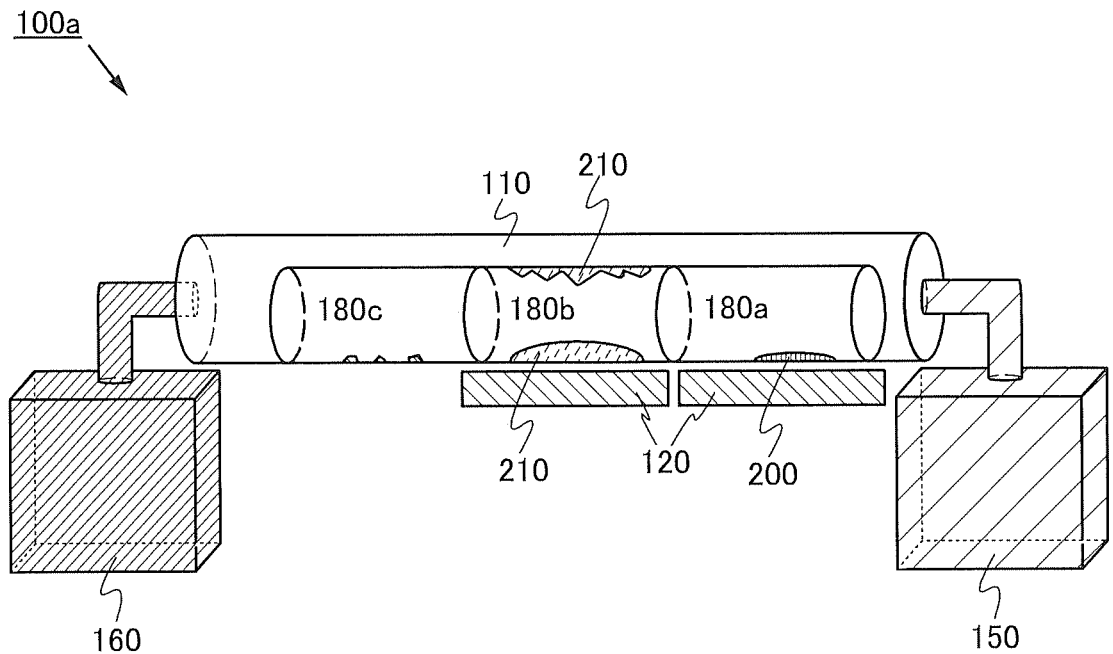
FIG. 2 Schematic views illustrating purification apparatuses of one embodiment of the present invention.

Next, details of the purification apparatus of one embodiment of the present invention are described using FIGS. 2(A) and (B). Note that in FIGS. 2(A) and (B), detailed description of portions having functions and structures similar to numerals shown in FIG. 1 are omitted in some cases.

FIGS. 2(A) and (B) are schematic views illustrating a purification apparatus 100a and a purification apparatus 100b of one embodiment of the present invention.

The purification portions 110 in the purification apparatus 100a and the purification apparatus 100b include a purification tube 180a, a purification tube 180b, and a purification tube 180c. The purification tube 180a has a function as a first purification tube for placing a sample 200 in the purification portion 110, and the purification tube 180b has a function as a second purification tube for collecting an intended substance 210. The purification tubes are preferably provided inside the purification portion 110, which facilitates placement of the sample and collection of the intended substance. Note that the number of purification tubes placed in the purification portion 110 can be changed as appropriate depending on the shape of the purification portion 110, the temperature gradient, or the like.

The structure of the purification tubes is hollow such that at least the vaporized sample (including the intended substance) can pass, and an opening is provided at an end portion shaped by an adjacent purification tube. As in the purification apparatus 100a, purification tubes having a tubular shaped structure may be used. As in the purification apparatus 100b, purification tubes having a structure in which an end portion of a purification tube is loosely fitted into another purification tube adjacent thereto may be used.

For the purification tubes, a material that reacts poorly with the intended substance, allows little entry of impurities, and has adequate strength to withstand the temperature and reduced pressure in the purification is preferred. Specifically, glass or quartz is preferred.

Figure 2B:
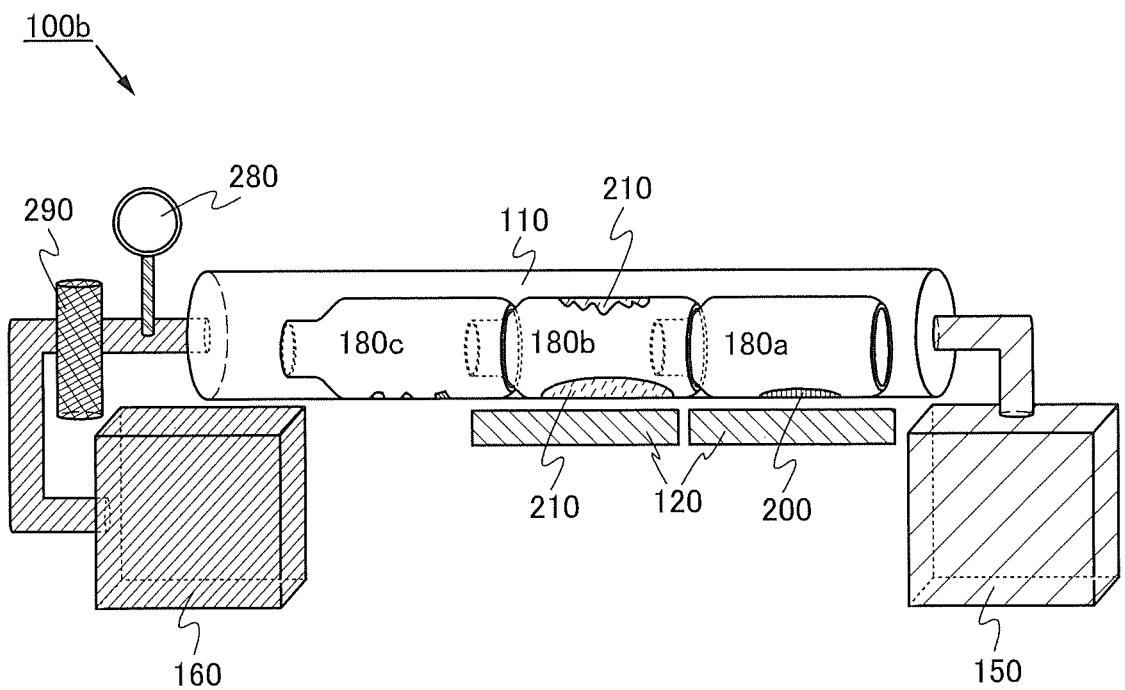

Moreover, in the purification apparatus of one embodiment of the present invention, a cooling trap 290 may be provided between the gas discharge means 160 and the purification portion 110 as in the purification apparatus 100b shown in FIG. 2(B). The provision of the cooling trap 290 can prevent a substance that condenses or sublimes as a solid at normal temperature from reaching the gas discharge means 160. Moreover, the pressure in the purification portion 110 is measured with a pressure gauge 280 (also referred to as a vacuum gauge).

<Purification Method>

Next, a purification method of one embodiment of the present invention is described below.

Figure 3:
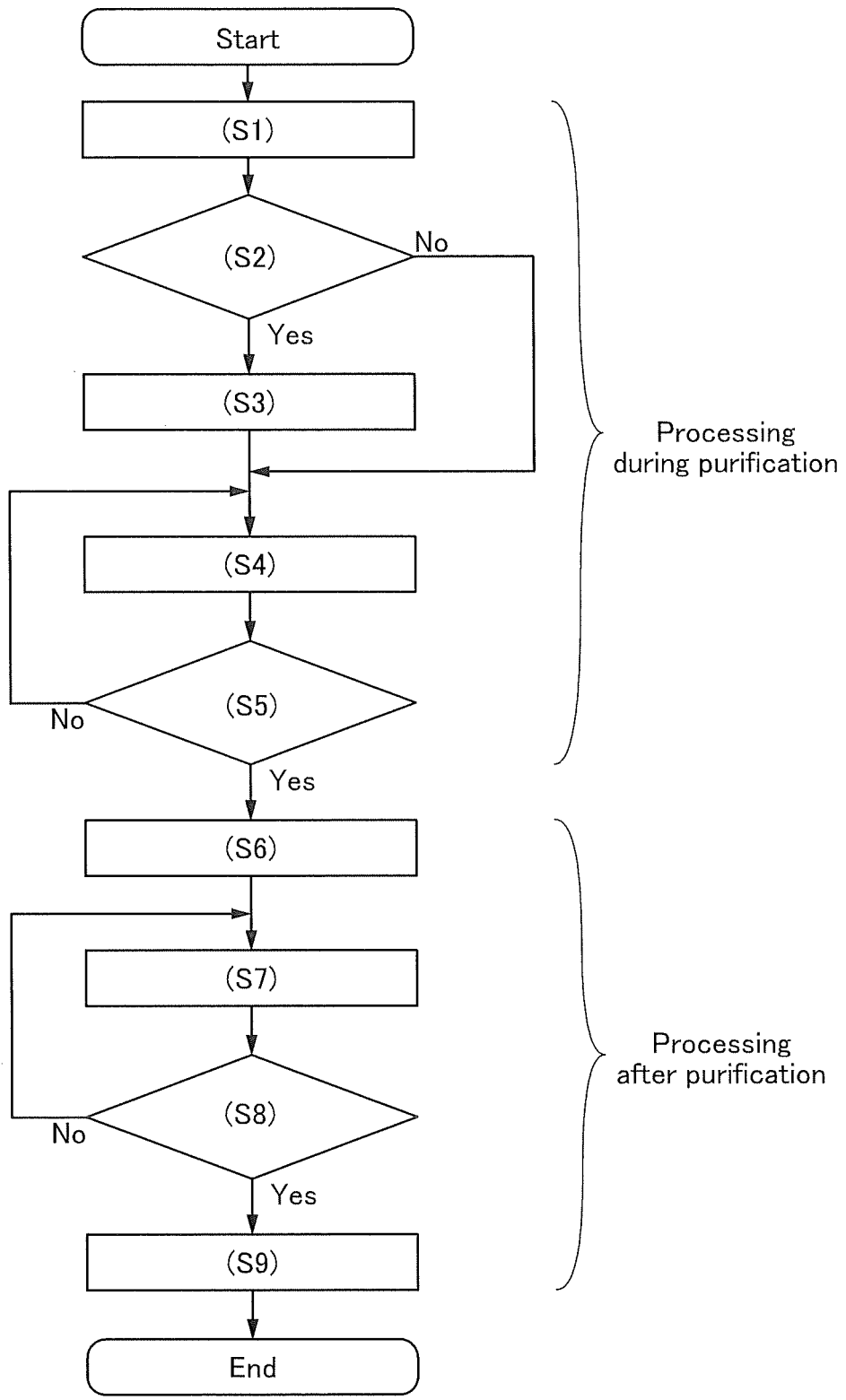
FIG. 3 A flow chart illustrating a purification method of one embodiment of the present invention.
Figure 4A:
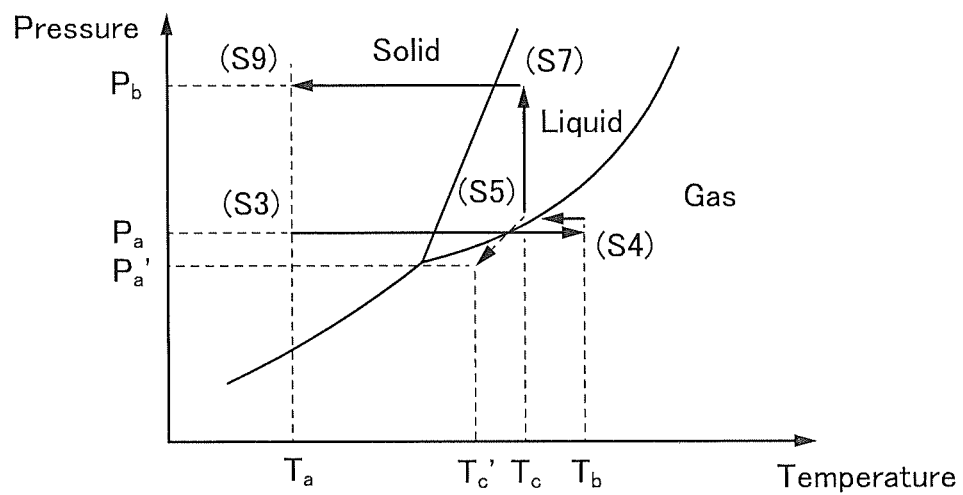
FIG. 4 Schematic views illustrating state changes of a substance according to one embodiment of the present invention.

FIG. 3 is a flow chart illustrating the main processing of the purification method of one embodiment of the present invention. FIGS. 4(A), (B), and (C) are schematic views illustrating state changes (also referred to as phase diagrams or state diagrams) of a substance according to one embodiment of the present invention.

Figure 4B:
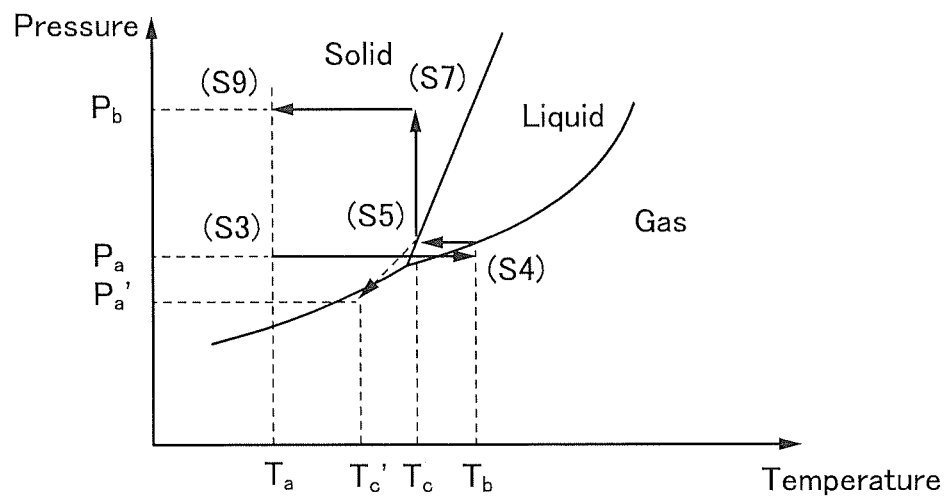
Figure 4C:
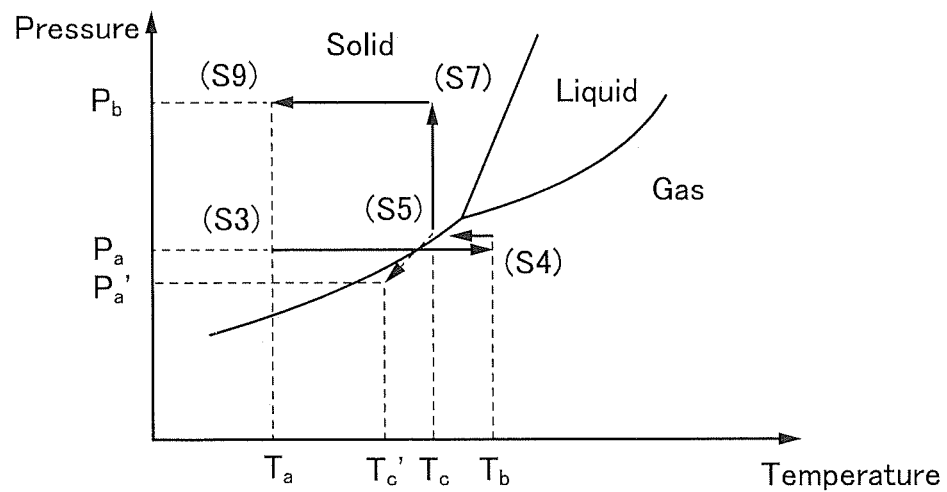

In FIGS. 4(A), (B), and (C), the boundary between a gas and a liquid is a vapor pressure curve, the boundary between a gas and a solid is a sublimation curve, and the boundary between a liquid and a solid is a fusion curve. Note that FIG. 4(A) shows an example of the case where the sample evaporates from a solid into a gas through a liquid and the intended substance condenses as a liquid in the purification portion. FIG. 4(B) shows an example of the case where the sample evaporates from a solid into a gas through a liquid and the intended substance deposits (condenses and solidifies, or sublimes) as a solid in the purification portion. FIG. 4(C) shows an example of the case where the sample sublimes from a solid into a gas and the intended substance sublimes as a solid in the purification portion. However, the substance according to one embodiment of the present invention is not limited thereto.

In a first step, the gas discharge means included in the purification apparatus is controlled and the pressure in the purification portion in which the sample is placed is reduced (see (S1) in FIG. 3). The reduction in the pressure in the purification portion can lower the temperature at which the sample vaporizes. Moreover, removal of oxygen, water, and the like in the purification portion can inhibit a reaction such as oxidation or decomposition of the intended substance.

In a second step, whether a gas is supplied into the purification portion or not is selected (see (S2) in FIG. 3). In the case where a gas is not supplied into the purification portion, the pressure in the purification portion is lower than or equal to 10 Pa, preferably lower than or equal to $1 \times 10^{-2}$ Pa, more preferably lower than or equal to $1 \times 10^{-3}$ Pa. With the pressure in the purification portion set in a high degree of vacuum (i.e., a low-pressure) state, the temperature at which the sample vaporizes can be reduced; therefore, the purification of a substance that is easy to thermally decompose in a high-pressure state can be made possible.

Moreover, in the case where a gas is supplied into the purification portion, in a third step, the gas supply means is controlled to supply the gas into the purification portion (see (S3) in FIG. 3). The pressure in the purification portion is preferably higher than or equal to 0.1 Pa and lower than or equal to 10 Pa. By the supply of the gas into the purification portion as a carrier gas, the vaporized sample can be diffused smoothly into the purification portion 110, and the intended sub can be condensed or sublimed efficiently. The sublimation temperature or evaporation temperature and the decomposition temperature of the intended substance in each pressure are measured, and the pressure in the purification portion is selected such that the difference between the sublimation temperature or evaporation temperature and the decomposition temperature is large. Moreover, in order that the pressure in the purification portion become such a pressure, the gas supply means and the gas discharge means are controlled.

Note that in FIGS. 4(A), (B), and (C), the state where the purification portion is at a normal temperature ($T_a$) and an intended pressure ($P_a$) is (S3).

After the purification portion has been in the intended pressure, in a fourth step, the temperature adjustment means is controlled and a temperature gradient in the purification portion is set (see (S4) in FIG. 3). In the case where the sample is placed in the vicinity of one end portion of the purification apparatus, the temperature gradient is preferably set such that, as the temperature of the purification portion, the temperature is lower the closer it is to the other end portion of the purification apparatus, whereas the temperature is high in the vicinity of the region where the sample is placed.

The temperature in the vicinity of the region where the sample is placed is set at a temperature ($T_b$) higher than or equal to the temperature at which the sample vaporizes and lower than the temperature at which the sample decomposes (see (S4) in FIG. 4). Moreover, due to the temperature gradient of the purification portion, the intended substance deposits in the purification portion in the vicinity of a temperature ($T_c$) at which the intended substance deposits (see FIG. 4 (S5) in FIG. 4).

In a fifth step, whether the purification is finished or not is selected (see (S5) in FIG. 3). The purification is finished around the timing at which the sample placed in the purification portion is reduced and the condensation of the intended substance is not increased in a range where the intended substance condenses. Note that the timing at which the purification is finished may be set at a predetermined time in the purification apparatus.

After the purification, in a sixth step and a seventh step, the gas discharge means and the gas supply means are controlled and the pressure in the purification portion is increased (see (S6) and (S7) in FIG. 3). At this time, the pressure in the purification portion is preferably a pressure higher than or equal to the atmospheric pressure. One of the features of the purification method of one embodiment of the present invention is that the pressure inside the purification portion is made higher than or equal to the atmospheric pressure before the temperature of the purification portion is reduced. This can prevent the phenomenon of re-vaporization of the intended substance which has deposited as a liquid or a solid after the purification.

According to Boyle Charles' law, when the volume is constant, the temperature and pressure of a gas are proportional to each other. This means that, since the volume of the purification portion does not change, even when the temperature of the purification portion is decreased without intentionally changing the pressure in the purification portion, the pressure in the purification portion is decreased while the temperature of the purification portion is decreased. At this time, the intended substance which has deposited as a liquid or a solid in the purification portion re-vaporizes in some cases. This is a phenomenon that occurs in the case where, in FIGS. 4(A), (B), and (C), both the temperature and the pressure are decreased from the temperature $T_c$ and the pressure $P_a$ to a temperature $T_c'$ and a pressure $P_a'$ which are the range where the intended substance becomes a gas.

In the purification method of one embodiment of the present invention, before the temperature of the purification portion is decreased, the pressure in the purification portion is made higher than or equal to the atmospheric pressure (see (S7) in FIG. 4). This can prevent the phenomenon of re-vaporization of the intended substance from a liquid or a solid after the purification. Moreover, the re-vaporization of the intended substance from a liquid or a solid is accompanied by a sudden volume change, which results in scattering of the intended substance or breakage of the purification portion, specifically breakage of the purification tube included in the purification portion or the like, in some cases. Moreover, in the case where the intended substance is scattered or the purification portion, the purification tube, or the like is broken, there are a case where impurities and the like enter the intended substance, resulting in a reduction in the purity of the intended substance or a case where the intended substance is dispersed, resulting in a reduction in collection amount. Note that the atmospheric pressure is a pressure of approximately $1.0 \times 10^5$ Pa; the atmospheric pressure or a pressure in the vicinity of the atmospheric pressure is applicable in one embodiment of the present invention, and specifically, a pressure higher than or equal to $5.0 \times 10^4$ Pa and lower than or equal to $2.0 \times 10^5$ Pa, preferably higher than or equal to $9.0 \times 10^4$ Pa and lower than or equal to $1.5 \times 10^5$ Pa is applicable.

Moreover, when the intended substance which has been purified in the purification portion is a liquid, the intended substance is gathered to form a pool in the lower portion of the purification portion. When the temperature of the purification portion is cooled in this state of a pool, a decrease in temperature allows the liquid of the intended substance which has been purified to solidify into a solid through the freezing point in some cases. A further decrease in temperature from the freezing point decreases the volume of the solid according to the volume expansion coefficient. In the case where the temperature of the purification portion is decreased while the purification portion is kept from the pressure $P_a'$ to the pressure $P_a$ without having the atmospheric pressure or higher before the temperature of the purification portion is lowered, the larger the temperature difference between the freezing point and room temperature is, the more the volume of the solid changes in the temperature decrease process. In addition, with the change in the volume of the solid, the solid (intended substance) in the purification portion is crushed in some cases. Furthermore, the crush of the solid (intended substance) in the purification portion allows the intended substance which has been purified to scatter and mix with impurities and the like, which causes the problems of a reduction in collection amount and a reduction in the purity of the intended substance. Moreover, when the amount of purified solid (intended substance) in the purification portion is increased, the crush of the solid causes the problem of breakage of the purification tube. The problem of breakage of the purification portion is more likely to arise as the sublimation purification apparatus becomes larger; it becomes conspicuous when the outside diameter of the purification portion 110 is 100 mm or more, for example.

Meanwhile, in the purification method of one embodiment of the present invention, the inside of the purification portion is set at a pressure higher than or equal to the atmospheric pressure when cooled, so that the aforementioned breakage of the purification portion can be prevented. Moreover, the reduction in purity or the reduction in collection amount due to the breakage of the purification portion and the like can be inhibited. Thus, according to the purification method of one embodiment of the present invention, breakage of the purification portion can be prevented and the intended substance with a high purity can be obtained in a high yield.

Next, in an eighth step, the processing of checking whether the inside of the purification portion is higher than or equal to the atmospheric pressure is performed (see (S8) in FIG. 3).

Moreover, when the inside of the purification portion is higher than or equal to the atmospheric pressure, in a ninth step, the temperature adjustment means is controlled and the temperature of the purification portion is reduced to the vicinity of normal temperature (see (S9) in FIG. 3). Consequently, the intended substance which has been purified inside the purification portion can be collected as a solid (see (S9) in FIG. 4).

As described above, according to one embodiment of the present invention, a purification method with which breakage of a purification portion after purification is prevented and an intended substance with a high purity is obtained in a high yield can be provided.

Moreover, one embodiment of the present invention includes not only the above purification method but also a purification apparatus having a control system including a function of controlling a gas supply means, a gas discharge means, and a temperature adjustment means. In the purification apparatus, the control system has a program performing processing similar to the flow chart shown in FIG. 3. Thus, a purification apparatus in which a purification portion is less likely to break can be provided. Moreover, a purification apparatus that enables an intended substance with a high purity to be obtained in a high yield can be provided.

<Purification Tube>

Next, the purification tube according to one embodiment of the present invention is described below.

The structure of the purification tube according to one embodiment of the present invention is hollow such that at least the vaporized sample (including the intended substance) can pass. The structure is provided with an opening in an end portion adjacent to a purification tube and is a tubular shaped structure.

Figure 5A:
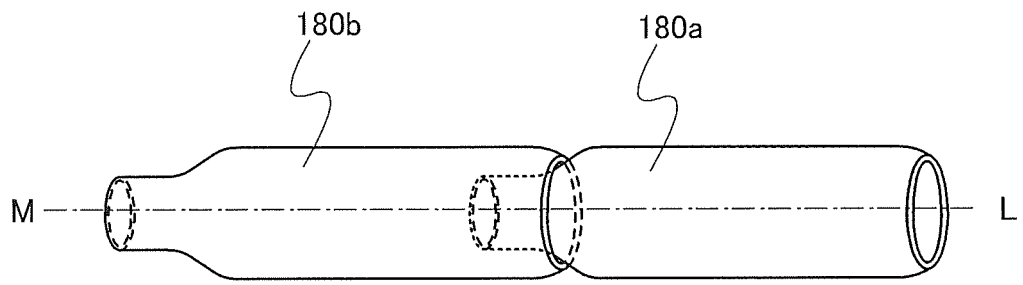
FIG. 5 Schematic views illustrating a purification tube according to one embodiment of the present invention.
Figure 5B:
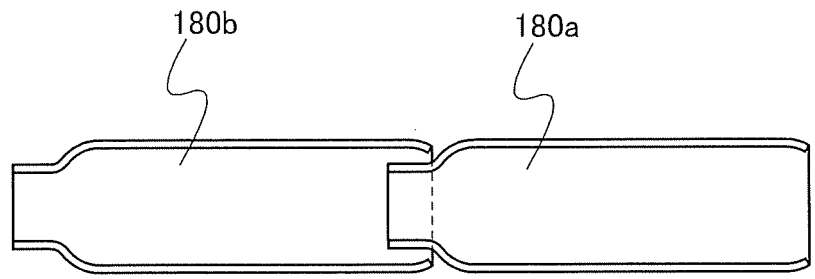

FIGS. 5(A), (B), and (C) are schematic views illustrating an example of the purification tube according to one embodiment of the present invention. FIG. 5(A) is an example of the case where an end portion of the purification tube is placed by being loosely fitted into another purification tube adjacent thereto. FIG. 5(B) corresponds to a cross section of a portion indicated by the dash-dot line M-L in FIG. 5(A). Moreover, FIG. 5(C) corresponds to a cross section in the direction perpendicular to a flow path of the vaporized sample.

The purification tubes shown in FIG. 5(A) include openings at both end portions, and an end portion of the purification tube 180a is placed to be loosely fitted into an end portion of the adjacent purification tube 180b. Note that in the purification tube according to one embodiment of the present invention, one end portion that is not loosely fitted into another purification tube does not necessarily have an opening.

Figure 5C:
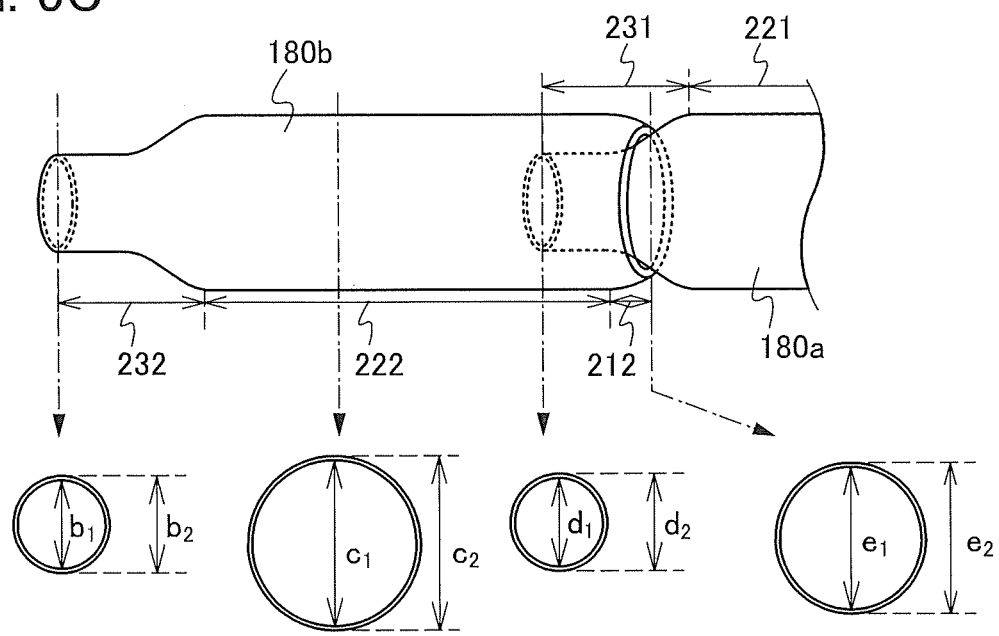

As shown in FIG. 5(C), the purification tube 180b includes a first end portion 232, a middle portion 222, and a second end portion 212. The purification tube 180a similarly includes a first end portion 231, a middle portion 221, and a second end portion. Note that in FIG. 5(C), the second end portion of the purification tube 180*a* is omitted and not shown in the figure. In FIG. 5(C), the purification tube 180*a* and the purification tube 180*b* are placed to be loosely fitted into each other by insertion of at least the first end portion 231 of the purification tube 180*a* into the second end portion 212 of the purification tube 180*b*.

In FIG. 5(C), $b_1$ and $b_2$ denote the tube inside diameter and tube outside diameter at the first end portion 232 of the purification tube 180*b*; $c_1$ and $c_2$ denote the tube inside diameter and tube outside diameter at the middle portion 222 of the purification tube 180*b*; $e_1$ and $e_2$ denote the tube inside diameter and tube outside diameter at the second end portion 212 of the purification tube 180*b*; and $d_1$ and $d_2$ denote the tube inside diameter and tube outside diameter at the first end portion 231 of the purification tube 180*a*. Note that a cross section having the tube inside diameter $b_1$, a cross section having the tube inside diameter $c_1$, and a cross section having the tube inside diameter $e_1$ are preferably concentric circles for simplification at the time of arrangement.

In the purification tube 180*b*, the thickness of the first end portion 232 ($b_2$-$b_1$), the thickness of the middle portion 222 ($c_2$-$c_1$), and the thickness of the second end portion 212 ($e_2$-$e_1$) are preferably nearly equal to maintain the strength of the purification tube or to prevent the temperature from becoming nonuniform. Specifically, the thickness of the purification tube preferably has a thickness of 4 mm or more or a thickness of 2% or more, preferably 3% or more, more preferably 5% or more of the tube outside diameter of the middle portion 222. Note that the thickness of the purification tube is preferably a thickness of 4 mm or more in the case where the tube outside diameter $c_2$ is 80 mm or more, and the thickness of the purification tube is preferably a thickness of 6 mm or more in the case where the tube outside diameter $c_2$ is 170 mm or more. Moreover, the thickness of the purification tube is preferably less than or equal to $c_2$-$e_2$.

Moreover, in order that the purification tube 180*a* and the purification tube 180*b* be placed to be loosely fitted into each other, the tube inside diameter ($e_1$) of the endmost portion at the second end portion 212 of the purification tube 180*b* is preferably larger than the tube outside diameter ($d_2$) at the first end portion 231 of the purification tube 180*a*. In other words, it is preferable that $e_1 > d_2$ be satisfied; $0.99e_1 \geq d_2 \geq 0.01e_1$ is more preferred and $0.95e_1 \geq d_2 \geq 0.85e_1$ is further preferred.

Moreover, in the purification tube 180*b*, the tube outside diameters of the first end portion 232 and the second end portion 212 are preferably smaller than the tube inside diameter of the middle portion 222. In other words, it is preferable that $c_1 \geq e_2 \geq b_2$ be satisfied; $0.95c_1 \geq e_2 \geq 0.65c_1$ and $0.75c_1 \geq b_2 \geq 0.55c_1$ are more preferred.

Due to the purification tubes having the above structure which are placed to be loosely fitted into each other, the intended substance which has deposited can be prevented from leaking from the end portions of the purification tubes.

Note that the first end portion 231 of the purification tube 180*a* has a region overlapping with the second end portion 212 of the purification tube 180*b*. In other words, the purification tube 180*a* and the purification tube 180*b* may have a gap or be in contact in a portion where they are loosely fitted into each other.

Note that the outside diameter of the purification tube is preferably large to some extent in order to have the above structure of the purification tubes. Specifically, the tube outside diameter ($c_2$) of the middle portion of the purification tube is 60 mm or more, preferably 80 mm or more.

As described above, according to one embodiment of the present invention, a substance with a high purity can be purified in a high yield. Moreover, according to one embodiment of the present invention, a light-emitting element or a semiconductor element including a substance with a high purity can be provided. Moreover, according to one embodiment of the present invention, a highly reliable light-emitting element or semiconductor element can be provided.

The structure described in this embodiment can be used in combination with the structures described in the other embodiments as appropriate.

Embodiment 2

In this embodiment, a manufacturing method of a light-emitting element using the purification method described in Embodiment 1 and a structure example thereof are described below using FIGS. 6(A) and (B).

First, the structure examples of light-emitting elements of one embodiment of the present invention are described below using FIGS. 6(A) and (B).

Structure Example 1 of Light-Emitting Element

Figure 6A:
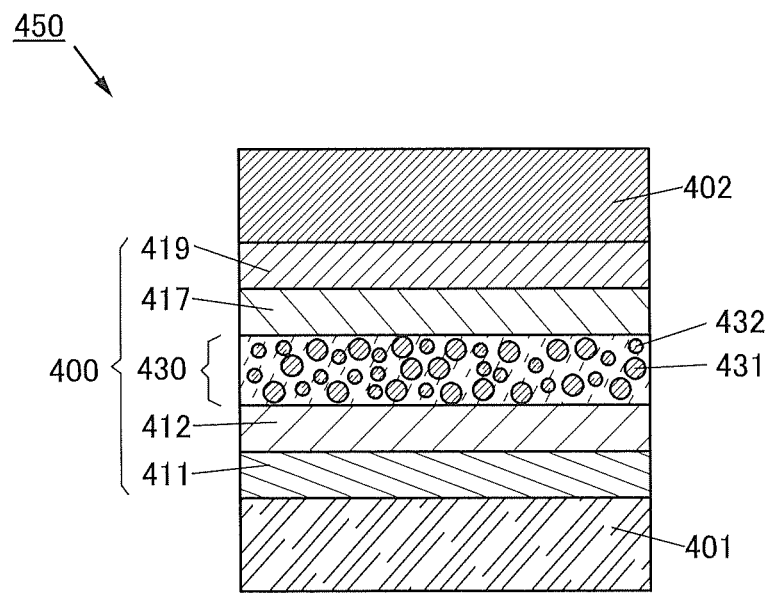
FIG. 6 Schematic cross-sectional views of light-emitting elements according to one embodiment of the present invention.

FIG. 6(A) is a schematic cross-sectional view of a light-emitting element 450 of one embodiment of the present invention.

The light-emitting element 450 includes a pair of electrodes (an electrode 401 and an electrode 402) and an EL layer 400 between the pair of electrodes. The EL layer 400 includes at least a light-emitting layer 430.

The EL layer 400 shown in FIG. 6(A) includes functional layers such as a hole-injection layer 411, a hole-transport layer 412, an electron-transport layer 418, and an electron-injection layer 419, in addition to the light-emitting layer 430.

Note that, although description is given assuming that the electrode 401 and the electrode 402 of the pair of electrodes serve as an anode and a cathode in this embodiment, the structure of the light-emitting element 450 is not limited thereto. That is, the electrode 401 may be a cathode, the electrode 402 may be an anode, and the stacking order of the layers between the electrodes may be reversed. In other words, the hole-injection layer 411, the hole-transport layer 412, the light-emitting layer 430, the electron-transport layer 418, and the electron-injection layer 419 may be stacked in this order from the anode side.

Note that the structure of the EL layer 400 is not limited to the structure shown in FIG. 6(A), and a structure including, in addition to the light-emitting layer 430, at least one selected from the hole-injection layer 411, the hole-transport layer 412, the electron-transport layer 418, and the electron-injection layer 419 is employed. Alternatively, the EL layer 400 may have a structure including functional layers which has a function such as capability of lowering a hole- or electron-injection barrier, improving a hole- or electron-transport property, inhibiting a hole- or electron-transport property, or suppressing a quenching phenomenon by an electrode, for example. Note that the functional layers may each be a single layer or a structure in which a plurality of layers are stacked.

In the light-emitting element 450 in FIG. 6(A), the substance purified by the purification method described in Embodiment 1 is used in any layer in the EL layer 400.

Since the purification method described in Embodiment 1 can increase the purity of a substance, the substance is preferably used for a host material or a carrier-transport material in a light-emitting element. Thus, the structure of this embodiment can provide a light-emitting element with favorable reliability.

Moreover, the light-emitting layer 430 includes a guest material 431 and a host material 432.

An organic material having a light-emitting property is used as the guest material 431. As the organic material having a light-emitting property, a compound that can emit fluorescence (a fluorescent compound) or a compound that can emit phosphorescence (a phosphorescent compound) can be used.

In the light-emitting element 450 of one embodiment of the present invention, voltage application between the pair of electrodes (the electrode 401 and the electrode 402) allows electrons and holes (holes) to be injected from the cathode and the anode into the EL layer 400 and thus a current flows. Then, by recombination of the injected electrons and holes, excitons are formed. The ratio between singlet excitons and triplet excitons (hereinafter, exciton generation probability) which are generated by the recombination of the carriers (electrons and holes) is 1:3 according to the statistical probability. Accordingly, in a light-emitting element that uses a fluorescent compound, singlet excitons which contribute to light emission are generated at a rate of 25% and triplet excitons which does not contribute to light emission are generated at a rate of 75%. By contrast, in a light-emitting element that uses a phosphorescent compound, both singlet excitons and triplet excitons can contribute to light emission. Accordingly, the light-emitting element that uses a phosphorescent compound is preferred because it has higher emission efficiency than the light-emitting element that uses a fluorescent compound.

Note that the exciton refers to a pair of carriers (an electron and a hole). Since excitons have energy, a material where excitons are generated is brought into an excited state.

In the case where a fluorescent compound is used as the guest material 431, the S1 level of the host material 432 is preferably higher than the S1 level of the guest material 431. In that case, singlet excitation energy of the host material 432 can transfer from the S1 level of the host material 432 to the S1 level of the guest material 431. As a result, the guest material 431 is brought into a singlet excited state to emit fluorescence.

Moreover, when a phosphorescent compound is used as the guest material 431, the T1 level of the host material 432 is preferably higher than the T1 level of the guest material 431. In that case, singlet excitation energy and triplet excitation energy of the host material 432 can transfer from the S1 level and T1 level of the host material 432 to the T1 level of the guest material 431. As a result, the guest material 431 is brought into a triplet excited state to emit phosphorescence.

To efficiently obtain light emission from the singlet excited state of the guest material 431, the fluorescence quantum yield of the guest material 431 is preferably high, and specifically, 50% or higher, further preferably 70% or higher, still further preferably 90% or higher.

When the light-emitting layer 430 has the above-described structure, light emission from the guest material 431 of the light-emitting layer 430 can be obtained efficiently.
Structure Example 2 of Light-Emitting Element Next, a light-emitting element having a structure different from the structure of the light-emitting element 450 and light emission mechanism of the light-emitting element are described below using FIG. 6(B). Note that in FIG. 6(B), similar hatch patterns are used for a portion having a function similar to the numeral shown in FIG. 6(A) and the numeral is omitted in some cases. Moreover, similar numerals are used for portions having similar functions, and a detailed description thereof is omitted in some cases.

Figure 6B:
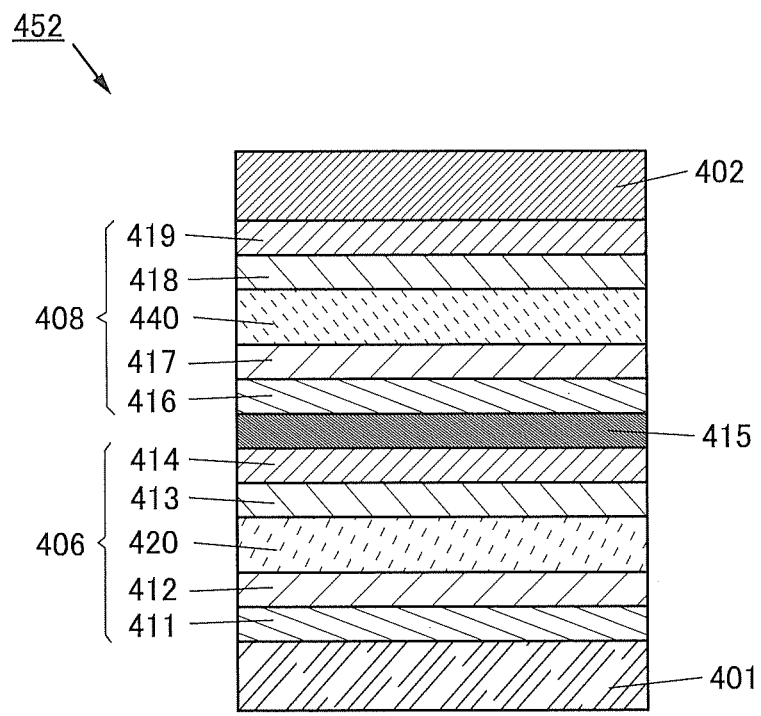

FIG. 6(B) is a schematic cross-sectional view of a light-emitting element 452.

The light-emitting element 452 shown in FIG. 6(B) includes a plurality of light-emitting units (a light-emitting unit 406 and a light-emitting unit 408 in FIG. 6(B)) between a pair of electrodes (the electrode 401 and the electrode 402). That is, the light-emitting element 450 shown in FIG. 6(A) includes one light-emitting unit, while the light-emitting element 452 includes a plurality of light-emitting units. Note that the electrode 401 functions as an anode and the electrode 402 functions as a cathode in the light-emitting element 452 in the following description; however, the structure of the light-emitting element 452 may be reversed.

Moreover, in the light-emitting element 452 shown in FIG. 6(B), the light-emitting unit 406 and the light-emitting unit 408 are stacked, and a charge-generation layer 415 is provided between the light-emitting unit 406 and the light-emitting unit 408. Note that the light-emitting unit 406 and the light-emitting unit 408 may have the same structure or different structures.

Moreover, the light-emitting element 452 includes a light-emitting layer 420 and a light-emitting layer 440. Moreover, the light-emitting unit 406 includes the hole-injection layer 411, the hole-transport layer 412, an electron-transport layer 413, and an electron-injection layer 414 in addition to the light-emitting layer 420. Moreover, the light-emitting unit 408 includes the hole-injection layer 416, the hole-transport layer 417, the electron-transport layer 418, and the electron-injection layer 419 in addition to the light-emitting layer 440. Moreover, for the light-emitting layer 420 and the light-emitting layer 440, a structure similar to the light-emitting layer 430 included in the above light-emitting element 450 can be used.

The charge-generation layer 415 may have either a structure in which a substance having an acceptor property which is an electron acceptor is added to a hole-transport material or a structure in which a substance having a donor property which is an electron donor is added to an electron-transport material. Moreover, both of these structures may be stacked.

In the case where the charge-generation layer 415 contains a composite material of an organic compound and a substance having an acceptor property, the composite material that can be used for the hole-injection layer 411 described later is used for the composite material. As the organic compound, a variety of compounds such as an aromatic amine compound, a carbazole compound, an aromatic hydrocarbon, and a high molecular compound (such as an oligomer, a dendrimer, or a polymer) can be used. Note that an organic compound having a hole mobility of $1 \times 10^{-6}$ cm$^2$/Vs or higher is preferably used. However, other than these, any substance in which the transport property of holes is higher than that of electrons may be used. Since the composite material of an organic compound and a substance having an acceptor property has excellent carrier-injection and carrier-transport properties, low-voltage driving or low-current driving can be realized. Note that in the case where a surface of a light-emitting unit on the anode side is in contact with the charge-generation layer 415, the charge-generation layer 415 can also serve as a hole-injection layer or a hole-transport layer of the light-emitting unit; thus, a structure in which a hole-injection layer or a hole-transport layer is not provided in the light-emitting unit may be employed. Alternatively, in the case where a surface of a light-emitting unit on the cathode side is in contact with the charge-generation layer 415, the charge-generation layer 415 can also serve as an electron-injection layer or an electron-transport layer of the light-emitting unit; thus, a structure in which an electron-injection layer or an electron-transport layer is not provided in the light-emitting unit may be employed.

Note that the charge-generation layer 415 may form a stacked structure in which a layer containing the composite material of an organic compound and a substance having an acceptor property and a layer formed of another material are combined. For example, the charge-generation layer 415 may be formed of a combination of a layer containing the composite material of an organic compound and a substance having an acceptor property and a layer containing one compound selected from among electron-donating substances and a compound having a high electron-transport property. Moreover, the charge-generation layer 415 may be formed of a combination of a layer containing the composite material of an organic compound and a substance having an acceptor property and a layer containing a transparent conductive film.

Note that the charge-generation layer 415 sandwiched between the light-emitting unit 406 and the light-emitting unit 408 injects electrons into one of the light-emitting units and injects holes into the other of the light-emitting units when a voltage is applied to the electrode 401 and the electrode 402. For example, in FIG. 6(B), the charge-generation layer 415 injects electrons into the light-emitting unit 406 and holes into the light-emitting unit 408 when voltage is applied such that the potential of the electrode 401 is higher than the potential of the electrode 402.

Note that in terms of light extraction efficiency, the charge-generation layer 415 preferably has a property of transmitting light with respect to visible light (specifically, the transmittance of visible light through the charge-generation layer 415 is higher than or equal to 40%). Moreover, the charge-generation layer 415 functions even if it has lower conductivity than the pair of electrodes (the electrode 401 and the electrode 402).

Forming the charge-generation layer 415 using the above-described materials can inhibit an increase in driving voltage in the case where the light-emitting layers are stacked.

Moreover, the light-emitting element having two light-emitting units has been illustrated in FIG. 6(B); however, a light-emitting element in which three or more light-emitting units are stacked can be similarly employed. With a plurality of light-emitting units partitioned by the charge-generation layer between a pair of electrodes as shown by the light-emitting element 452, it is possible to realize a light-emitting element which can emit light having high luminance with the current density kept low and has a long lifetime. Moreover, a light-emitting element with low power consumption can be realized.

Note that with use of the substance purified by the purification method of one embodiment of the present invention which is described in Embodiment 1 for at least one of the units, a light-emitting element with high reliability can be provided.

Note that in each of the above structures, the emission colors exhibited by the guest materials used in the light-emitting unit 406 and the light-emitting unit 408 may be the same as or different from each other. In the case where guest materials having a function of exhibiting light emission of the same color are used for the light-emitting unit 406 and the light-emitting unit 408, the light-emitting element 452 can exhibit high emission luminance at a small current value, which is preferred. Moreover, in the case where guest materials having a function of exhibiting light emission of different colors are used for the light-emitting unit 406 and the light-emitting unit 408, the light-emitting element 452 can exhibit multi-color light emission, which is preferred. In this case, with use of a plurality of light-emitting materials with different emission wavelengths in one or both of the light-emitting layer 420 and the light-emitting layer 440, an emission spectrum exhibited by the light-emitting element 452 is light synthesized by light emission having different emission peaks and thus is an emission spectrum having at least two maximum values.

The above structure is also suitable for obtaining white light emission. Light of the light-emitting layer 420 and the light-emitting layer 440 is made to be complementary colors, white light emission can be obtained. It is particularly favorable to select the guest materials so that white light emission with high color rendering properties or light emission including at least red, green, and blue can be obtained.

Moreover, at least one of the light-emitting layer 420 and the light-emitting layer 440 may further be divided into layers and the divided layers may contain different light-emitting materials. That is, at least one of the light-emitting layer 420 and the light-emitting layer 440 can consist of two or more layers. For example, in the case where a first light-emitting layer and a second light-emitting layer are stacked in this order from the hole-transport layer side to form the light-emitting layer, there are a structure in which a substance having a hole-transport property is used as the host material of the first light-emitting layer and a substance having an electron-transport property is used as the host material of the second light-emitting layer, and the like. In this case, the light-emitting materials included in the first light-emitting layer and the second light-emitting layer may be the same as or different from each other and may be materials having functions of exhibiting light emission of the same color or materials exhibiting light emission of different colors. White light emission with a high color rendering property that is formed of three primary colors or four or more emission colors can also be obtained by using a structure including a plurality of light-emitting materials having functions of exhibiting light emission of colors different from each other <Material>

Next, components of a light-emitting element according to one embodiment of the present invention are described in detail below.

«Light-Emitting Layer»

Materials that can be used for the light-emitting layer 430 are each described below. Note that materials and structures similar thereto can also be used for the light-emitting layer 420 and the light-emitting layer 440.

In the light-emitting layer 430, the host material 432 is present in the highest proportion by weight, and the guest material 431 is dispersed in the host material 432.

The guest material 431 is preferably, but not particularly limited to, an anthracene derivative, a tetracene derivative, a chrysene derivative, a phenanthrene derivative, a pyrene derivative, a perylene derivative, a stilbene derivative, an acridone derivative, a coumarin derivative, a phenoxazine derivative, a phenothiazine derivative, or the like, and for example, the following materials can be used.

Specifically, 5,6-bis[4-(10-phenyl-9-anthryl)phenyl]-2,2'-bipyridine (abbreviation: PAP2BPy), 5,6-bis[4'-(10-phenyl-9-anthryl)biphenyl-4-yl]-2,2'-bipyridine (abbreviation: PAPP2BPy), N,N'-diphenyl-N,N'-bis[4-(9-phenyl-9H-fluoren-9-yl)phenyl]pyrene-1,6-diamine (abbreviation: 1,6FL-PAPrn), N,N-bis(3-methylphenyl)-N,N'-bis[3-(9-phenyl- 9H-fluoren-9-yl)phenyl]pyrene-1,6-diamine (abbreviation: 1,6mMemFLPAPrn), N,N-bis[4-(9-phenyl-9H-fluoren-9-yl)phenyl]-N,N'-bis(4-tert-butylphenyl)-pyrene-1,6-diamine (abbreviation: 1,6tBu-FLPAPrn), N,N'-diphenyl-N,N'-bis[4-(9-phenyl-9H-fluoren-9-yl)phenyl]-3,8-dicyclohexylpyrene-1,6-diamine (abbreviation: ch-1,6FLPAPrn), N,N'-(pyrene-1,6-diyl)bis[(6,N-diphenylbenzo[b]naphtho[1,2-d]furan)-8-amine] (abbreviation: 1,6BnfAPrn-03), N,N'-bis[4-(9H-carbazol-9-yl)phenyl]-N,N'-diphenylstilbene-4,4'-diamine (abbreviation: YGA2S), 4-(9H-carbazol-9-yl)-4'-(10-phenyl-9-anthryl)triphenylamine (abbreviation: YGAPA), 4-(9H-carbazol-9-yl)-4'-(9,10-diphenyl-2-anthryl)triphenylamine (abbreviation: 2YGAPPA), N,9-diphenyl-N-[4-(10-phenyl-9-anthryl)phenyl]-9H-carbazol-3-amine (abbreviation: PCAPA), perylene, 2,5,8,11-tetra(tert-butyl)perylene (abbreviation: TBP), 4-(10-phenyl-9-anthryl)-4'-(9-phenyl-9H-carbazol-3-yl)triphenylamine (abbreviation: PCBAPA), N,N''-(2-tert-butylanthracene-9,10-diyldi-4,1-phenylene)bis[N,N',N'-triphenyl-1,4-phenylenediamine] (abbreviation: DPABPA), N,9-diphenyl-N-[4-(9,10-diphenyl-2-anthryl)phenyl]-9H-carbazol-3-amine (abbreviation: 2PCAPPA), N-[4-(9,10-diphenyl-2-anthryl)phenyl]-N,N',N'-triphenyl-1,4-phenylenediamine (abbreviation: 2DPAPPA), N,N,N',N',N'',N'',N''',N'''-octaphenyldibenzo[g,p]chrysene-2,7,10,15-tetraamine (abbreviation: DBC1), coumarin 30, N-(9,10-diphenyl-2-anthryl)-N,9-diphenyl-9H-carbazol-3-amine (abbreviation: 2PCAPA), N-[9,10-bis(1,1'-biphenyl-2-yl)-2-anthryl]-N,9-diphenyl-9H-carbazol-3-amine (abbreviation: 2PCABPhA), N-(9,10-diphenyl-2-anthryl)-N,N',N'-triphenyl-1,4-phenylenediamine (abbreviation: 2DPAPA), N-[9,10-bis(1,1'-biphenyl-2-yl)-2-anthryl]-N,N',N'-triphenyl-1,4-phenylenediamine (abbreviation: 2DPABPhA), 9,10-bis(1,1'-biphenyl-2-yl)-N-[4-(9H-carbazol-9-yl)phenyl]-N-phenylanthracen-2-amine (abbreviation: 2YGABPhA), N,N,9-triphenylanthracen-9-amine (abbreviation: DPhAPhA), coumarin 6, coumarin 545T, N,N'-diphenylquinacridone (abbreviation: DPQd), rubrene, 2,8-di-tert-butyl-5,11-bis(4-tert-butylphenyl)-6,12-diphenyltetracene (abbreviation: TBRb), Nile red, 5,12-bis(1,1'-biphenyl-4-yl)-6,11-diphenyltetracene (abbreviation: BPT), 2-(2-{2-[4-(dimethylamino)phenyl]ethenyl}-6-methyl-4H-pyran-4-ylidene)propanedinitrile (abbreviation: DCM1), 2-{2-methyl-6-[2-(2,3,6,7-tetrahydro-1H,5H-benzo[ij]quinolizin-9-yl)ethenyl]-4H-pyran-4-ylidene}propanedinitrile (abbreviation: DCM2), N,N,N',N'-tetrakis(4-methylphenyl)tetracene-5,11-diamine (abbreviation: p-mPhTD), 7,14-diphenyl-N,N,N',N'-tetrakis(4-methylphenyl)acenaphtho[1,2-a]fluoranthene-3,10-diamine (abbreviation: p-mPhAFD), 2-{2-isopropyl-6-[2-(1,1,7,7-tetramethyl-2,3,6,7-tetrahydro-1H,5H-benzo[ij]quinolizin-9-yl)ethenyl]-4H-pyran-4-ylidene}propanedinitrile (abbreviation: DCJTI), 2-{2-tert-butyl-6-[2-(1,1,7,7-tetramethyl-2,3,6,7-trahydro-1H,5H-benzo[ij]quinolizin-9-yl)ethenyl]-4H-pyran-4-ylidene}propanedinitrile (abbreviation: DCJTB), 2-(2,6-bis{2-[4-(dimethylamino)phenyl]ethenyl}-4H-pyran-4-ylidene)propanedinitrile (abbreviation: BisDCM), 2-{2,6-bis[2-(8-methoxy-1,1,7,7-tetramethyl-2,3,6,7-tetrahydro-1H,5H-benzo[ij]quinolizin-9-yl)ethenyl]-4H-pyran-4-ylidene}propanedinitrile (abbreviation: BisDCJTM), 5,10,15,20-tetraphenylbisbenzo[5,6]indeno[1,2,3-cd:1',2',3'-lm]perylene, and the like are given.

Moreover, it is preferable that the host material 432 and the guest material 431 be selected such that the emission peak of the host material 432 overlaps with an absorption band on the longest wavelength side (low energy side) of the guest material 431. This enables a light-emitting element with drastically improved emission efficiency.

Moreover, as the guest material 431, an iridium-, rhodium-, or platinum-based organometallic complex or metal complex is given; in particular, an organoiridium complex such as an iridium-based ortho-metalated complex is preferred. As an ortho-metalated ligand, a 4H-triazole ligand, a 1H-triazole ligand, an imidazole ligand, a pyridine ligand, a pyrimidine ligand, a pyrazine ligand, an isoquinoline ligand, or the like is given. As the metal complex, a platinum complex having a porphyrin ligand or the like is given.

As the substance that has an emission peak in blue or green, for example, organometallic iridium complexes having a 4H-triazole skeleton, such as tris{2-[5-(2-methylphenyl)-4-(2,6-dimethylphenyl)-4H-1,2,4-triazol-3-yl-κN2]phenyl-κC}iridium(III) (abbreviation: Ir(mpptz-dmp)$_3$), tris(5-methyl-3,4-diphenyl-4H-1,2,4-triazolato)iridium(III) (abbreviation: Ir(Mptz)$_3$), tris[4-(3-biphenyl)-5-isopropyl-3-phenyl-4H-1,2,4-triazolato]iridium(III) (abbreviation: Ir(iPrptz-3b)$_3$), and tris[3-(5-biphenyl)-5-isopropyl-4-phenyl-4H-1,2,4-triazolato]iridium(III) (abbreviation: Ir(iPr5btz)$_3$); organometallic iridium complexes having a 1H-triazole skeleton, such as tris[3-methyl-1-(2-methylphenyl)-5-phenyl-1H-1,2,4-triazolato]iridium(III) (abbreviation: Ir(Mptz1-mp)$_3$) and tris(1-methyl-5-phenyl-3-propyl-1H-1,2,4-triazolato)iridium(III) (abbreviation: Ir(Prptz1-Me)$_3$); organometallic iridium complexes having an imidazole skeleton, such as fac-tris[1-(2,6-diisopropylphenyl)-2-phenyl-1H-imidazole]iridium(III) (abbreviation: Ir(iPrpmi)$_3$) and tris[3-(2,6-dimethylphenyl)-7-methylimidazo[1,2-f]phenanthridinato]iridium(III) (abbreviation: Ir(dmpimpt-Me)$_3$); and organometallic iridium complexes in which a phenylpyridine derivative having an electron-withdrawing group is a ligand, such as bis[2-(4',6'-difluorophenyl)pyridinato-N,C$^{2'}$]iridium(III) tetrakis(1-pyrazolyl)borate (abbreviation: FIr6), bis[2-(4',6'-difluorophenyl)pyridinato-N,C$^{2'}$]iridium(III) picolinate (abbreviation: FIrpic), bis{2-[3',5'-bis(trifluoromethyl)phenyl]pyridinato-N,C$^{2'}$}iridium(III) picolinate (abbreviation: Ir(CF$_3$ppy)$_2$(pic)), and bis[2-(4',6'-difluorophenyl)pyridinato-N,C$^{2'}$]iridium(III) acetylacetonate (abbreviation: FIr(acac)) are given. Among the above, the organometallic iridium complexes having a 4H-triazole skeleton have excellent reliability and emission efficiency and are thus especially preferred.

Moreover, as the substance that has an emission peak in green or yellow, for example, organometallic iridium complexes having a pyrimidine skeleton, such as tris(4-methyl-6-phenylpyrimidinato)iridium(III) (abbreviation: Ir(mppm)$_3$), tris(4-t-butyl-6-phenylpyrimidinato)iridium(III) (abbreviation: Ir(tBuppm)$_3$), (acetylacetonato)bis(6-methyl-4-phenylpyrimidinato)iridium(III) (abbreviation: Ir(mppm)$_2$(acac)), (acetylacetonato)bis(6-tert-butyl-4-phenylpyrimidinato)iridium(III) (abbreviation: Ir(tBuppm)$_2$(acac)), (acetylacetonato)bis[4-(2-norbornyl)-6-phenylpyrimidinato]iridium (III) (abbreviation: Ir(nbppm)$_2$(acac)), (acetylacetonato)bis[5-methyl-6-(2-methylphenyl)-4-phenylpyrimidinato]iridium(III) (abbreviation: Ir(mpmppm)$_2$(acac)), (acetylacetonato)bis{4,6-dimethyl-2-[6-(2,6-dimethylphenyl)-4-pyrimidinyl-κN3]phenyl-κC}iridium(III) (abbreviation: Ir(dmppm-dmp)$_2$(acac)), and (acetylacetonato)bis(4,6-diphenylpyrimidinato)iridium(III) (abbreviation: Ir(dppm)$_2$(acac)); organometallic iridium complexes having a pyrazine skeleton, such as (acetylacetonato)bis(3,5-dimethyl-2-phenylpyrazinato)iridium(III) (abbreviation: Ir(mppr-Me)$_2$(acac)) and (acetylacetonato)bis(5-isopropyl-3-methyl-2-phenylpyrazinato)iridium(III) (abbreviation: Ir(mppr-iPr)$_2$(acac)); organometallic iridium complexes having a pyridine skeleton, such as tris(2-phenylpyridinato-N,C$^{2'}$)iridium(III) (abbreviation: Ir(ppy)$_3$), bis(2-phenylpyridinato-N,C$^{2'}$)iridium(III) acetylacetonate (abbreviation: Ir(ppy)$_2$(acac)), bis(benzo[h]quinolinato)iridium(III) acetylacetonate (abbreviation: Ir(bzq)$_2$(acac)), tris(benzo[h]quinolinato)iridium(III) (abbreviation: Ir(bzq)$_3$), tris(2-phenylquinolinato-N,C$^{2'}$)iridium(III) (abbreviation: Ir(pq)$_3$), and bis(2-phenylquinolinato-N,C$^{2'}$)iridium(III) acetylacetonate (abbreviation: Ir(pq)$_2$(acac)); organometallic iridium complexes such as bis(2,4-diphenyl-1,3-oxazolato-N,C$^{2'}$)iridium(III) acetylacetonate (abbreviation: Ir(dpo)$_2$(acac)), bis{2-[4'-(perfluorophenyl)phenyl]pyridinato-N,C$^{2'}$}iridium(III) acetylacetonate (abbreviation: Ir(p-PF-ph)$_2$(acac)), and bis(2-phenylbenzothiazolato-N,C$^{2'}$)iridium(III) acetylacetonate (abbreviation: Ir(bt)$_2$(acac)); and a rare earth metal complex such as tris(acetylacetonato)(monophenanthroline)terbium(III) (abbreviation: Tb(acac)$_3$(Phen)) are given. Among the above, the organometallic iridium complexes having a pyrimidine skeleton have distinctively high reliability and emission efficiency and are thus particularly preferred.

Moreover, as the substance that has an emission peak in yellow or red, for example, organometallic iridium complexes having a pyrimidine skeleton, such as (diisobutyrylmethanato)bis[4,6-bis(3-methylphenyl)pyrimidinato]iridium(III) (abbreviation: Ir(5mdppm)$_2$(dibm)), bis[4,6-bis(3-methylphenyl)pyrimidinato](dipivaloylmethanato)iridium(III) (abbreviation: Ir(5mdppm)$_2$(dpm)), and bis[4,6-di(naphthalen-1-yl)pyrimidinato](dipivaloylmethanato)iridium(III) (abbreviation: Ir(dlnpm)$_2$(dpm)); organometallic iridium complexes having a pyrazine skeleton, such as (acetylacetonato)bis(2,3,5-triphenylpyrazinato)iridium(III) (abbreviation: Ir(tppr)$_2$(acac)), bis(2,3,5-triphenylpyrazinato) (dipivaloylmethanato)iridium(III) (abbreviation: Ir(tppr)$_2$(dpm)), and (acetylacetonato)bis[2,3-bis(4-fluorophenyl)quinoxalinato]iridium(III) (abbreviation: Ir(Fdpq)$_2$(acac)); organometallic iridium complexes having a pyridine skeleton, such as tris(1-phenylisoquinolinato-N,C$^{2'}$)iridium(III) (abbreviation: Ir(piq)$_3$) and bis(1-phenylisoquinolinato-N,C$^{2'}$)iridium(III) acetylacetonate (abbreviation: Ir(piq)$_2$(acac)); a platinum complex such as 2,3,7,8,12,13,17,18-octaethyl-21H,23H-porphyrin platinum (II) (abbreviation: PtOEP); and rare earth metal complexes such as tris(1,3-diphenyl-1,3-propanedionato)(monophenanthroline)europium(III) (abbreviation: Eu(DBM)$_3$(Phen)) and tris[1-(2-thenoyl)-3,3,3-trifluoroacetonato](monophenanthroline)europium(III) (abbreviation: Eu(TTA)$_3$(Phen)) are given. Among the above, the organometallic iridium complexes having a pyrimidine skeleton have distinctively high reliability and emission efficiency and are thus particularly preferred. Moreover, the organometallic iridium complexes having a pyrazine skeleton can provide red light emission with good chromaticity.

Note that the light-emitting material contained in the light-emitting layer 430 is a material that can convert triplet excitation energy into light emission. As the material that can convert triplet excitation energy into light emission, a thermally activated delayed fluorescence (Thermally activated delayed fluorescence: TADF) materials are given in addition to phosphorescent compounds. Therefore, the part described as a phosphorescent compound may be read as a thermally activated delayed fluorescent compound. A thermally activated delayed fluorescent compound is a material having a small difference between the S1 level and the T1 level and a function of converting triplet excitation energy into singlet excitation energy by reverse intersystem crossing. Thus, a little thermal energy enables up-conversion (reverse intersystem crossing) of a triplet excited state into a singlet excited state, and light emission (fluorescence) from the singlet excited state can be efficiently exhibited. Conditions where thermally activated delayed fluorescence is efficiently obtained are as follows: the energy difference between the S1 level and the T1 level is preferably greater than 0 eV and less than or equal to 0.3 eV, more preferably greater than 0 eV and less than or equal to 0.2 eV, further more preferably greater than 0 eV and less than or equal to 0.1 eV.

In the case where the thermally activated delayed fluorescent compound is composed of one kind of material, the following materials can be used, for example.

First, a fullerene, a derivative thereof, an acridine derivative such as proflavine, eosin, and the like are given. Moreover, a metal-containing porphyrin containing magnesium (Mg), zinc (Zn), cadmium (Cd), tin (Sn), platinum (Pt), indium (In), palladium (Pd), or the like is given. As the metal-containing porphyrin, a protoporphyrin-tin fluoride complex (SnF$_2$(Proto IX)), a mesoporphyrin-tin fluoride complex (SnF$_2$(Meso IX)), a hematoporphyrin-tin fluoride complex (SnF$_2$(Hemato IX)), a coproporphyrin tetramethyl ester-tin fluoride complex (SnF$_2$(Copro III-4Me)), an octaethylporphyrin-tin fluoride complex (SnF$_2$(OEP)), an etioporphyrin-tin fluoride complex (SnF$_2$(Etio I)), an octaethylporphyrin-platinum chloride complex (PtCl$_2$(OEP)), and the like are given, for example.

Moreover, as the thermally activated delayed fluorescent compound composed of one kind of material, a heterocyclic compound including a π-electron rich type heteroaromatic ring and a π-electron deficient type heteroaromatic ring can also be used. Specifically, 2-(biphenyl-4-yl)-4,6-bis(12-phenylindolo[2,3-a]carbazol-11-yl)-1,3,5-triazine (abbreviation: PIC-TRZ), 2-{4-[3-(N-phenyl-9H-carbazol-3-yl)-9H-carbazol-9-yl]phenyl}-4,6-diphenyl-1,3,5-triazine (abbreviation: PCCzPTzn), 2-[4-(10H-phenoxazin-10-yl)phenyl]-4,6-diphenyl-1,3,5-triazine (abbreviation: PXZ-TRZ), 3-[4-(5-phenyl-5,10-dihydrophenazin-10-yl)phenyl]-4,5-diphenyl-1,2,4-triazole (abbreviation: PPZ-3TPT), 3-(9,9-dimethyl-9H-acridin-10-yl)-9H-xanthen-9-one (abbreviation: ACRXTN), bis[4-(9,9-dimethyl-9,10-dihydroacridine)phenyl]sulfone (abbreviation: DMAC-DPS), 10-phenyl-10H,10'H-spiro[acridin-9,9'-anthracen]-10'-one (abbreviation: ACRSA), and the like are given. The heterocyclic compound is preferred because it includes the π-electron rich type heteroaromatic ring and the π-electron deficient type heteroaromatic ring and thus the electron-transport property and the hole-transport property are high. Among skeletons having the π-electron deficient type heteroaromatic ring, a diazine skeleton (a pyrimidine skeleton, a pyrazine skeleton, a pyridazine skeleton) or a triazine skeleton has stability and high reliability and is particularly preferred. Among skeletons having the π-electron rich type heteroaromatic ring, an acridine skeleton, a phenoxazine skeleton, a phenothiazine skeleton, a furan skeleton, a thiophene skeleton, and a pyrrole skeleton have stability and high reliability; therefore, one or more of these skeletons are preferably included. Note that as the pyrrole skeleton, an indole skeleton, a carbazole skeleton, and a 9-phenyl-3,3'-bi-9H-carbazole skeleton are particularly preferred. Note that a substance in which the π-electron rich type heteroaromatic ring is directly bonded to the π-electron deficient type heteroaromatic ring is particularly preferred because the donor property of the π-electron rich type heteroaromatic ring and the acceptor property of the π-electron deficient type heteroaromatic ring are both intense and the difference between the level of the singlet excited state and the level of the triplet excited state becomes small.

Moreover, the material that exhibits thermally activated delayed fluorescence may be a material that can by itself form a singlet excited state from a triplet excited state by reverse intersystem crossing or may be composed of a plurality of materials that form an exciplex (also referred to as exciplex or Exciplex).

It is preferable that the host material 432 and the guest material 431 (phosphorescent compound) be selected such that the emission peak of the host material 432 overlaps with an absorption band, more specifically an absorption band on the longest wavelength side, of triplet MLCT (Metal to Ligand Charge Transfer) transition of the guest material 431 (phosphorescent compound). This enables a light-emitting element with drastically improved emission efficiency. Note that in the case where a thermally activated delayed fluorescent compound is used instead of the phosphorescent compound, it is preferable that the absorption band on the longest wavelength side be a singlet absorption band.

As the host material 432, the following hole-transport materials and electron-transport materials can be used.

As the hole-transport material, a material in which the transport property of holes is higher than that of electrons can be used and a material having a hole mobility of $1 \times 10^{-6}$ cm$^2$/Vs or higher is preferred. Specifically, an aromatic amine, a carbazole derivative, an aromatic hydrocarbon, a stilbene derivative, or the like can be used. Moreover, the hole-transport material may be a high molecular compound.

As these materials having a high hole-transport property, for example, N,N'-di(p-tolyl)-N,N'-diphenyl-p-phenylenediamine (abbreviation: DTDPPA), 4,4'-bis[N-(4-diphenylaminophenyl)-N-phenylamino]biphenyl (abbreviation: DPAB), N,N'-bis{4-[bis(3-methylphenyl)amino]phenyl}-N,N'-diphenyl-(1,1'-biphenyl)-4,4'-diamine (abbreviation: DNTPD), 1,3,5-tris[N-(4-diphenylaminophenyl)-N-phenylamino]benzene (abbreviation: DPA3B), and the like can be given as aromatic amine compounds.

Moreover, as carbazole derivatives, specifically, 3-[N-(4-diphenylaminophenyl)-N-phenylamino]-9-phenylcarbazole (abbreviation: PCzDPA1), 3,6-bis[N-(4-diphenylaminophenyl)-N-phenylamino]-9-phenylcarbazole (abbreviation: PCzDPA2), 3,6-bis[N-(4-diphenylaminophenyl)-N-(1-naphthyl)amino]-9-phenylcarbazole (abbreviation: PCzTPN2), 3-[N-(9-phenylcarbazol-3-yl)-N-phenylamino]-9-phenylcarbazole (abbreviation: PCzPCA1), 3,6-bis[N-(9-phenylcarbazol-3-yl)-N-phenylamino]-9-phenylcarbazole (abbreviation: PCzPCA2), 3-[N-(1-naphthyl)-N-(9-phenylcarbazol-3-yl)amino]-9-phenylcarbazole (abbreviation: PCzPCN1), and the like can be given.

Moreover, as other carbazole derivatives, 4'-di(N-carbazolyl)biphenyl (abbreviation: CBP), 1,3,5-tris[4-(N-carbazolyl)phenyl]benzene (abbreviation: TCPB), 9-[4-(10-phenyl-9-anthryephenyl]-9H-carbazole (abbreviation: CzPA), 1,4-bis[4-(N-carbazolyl)phenyl]-2,3,5,6-tetraphenylbenzene, or the like can be used.

Moreover, as the aromatic hydrocarbon, 2-tert-butyl-9,10-di(2-naphthyl)anthracene (abbreviation: t-BuDNA), 2-tert-butyl-9,10-di(1-naphthyl)anthracene, 9,10-bis(3,5-diphenylphenyl)anthracene (abbreviation: DPPA), 2-tert-butyl-9,10-bis(4-phenylphenyeanthracene (abbreviation: t-BuDBA), 9,10-di(2-naphthyl)anthracene (abbreviation: DNA), 9,10-diphenylanthracene (abbreviation: DPAnth), 2-tert-butylanthracene (abbreviation: t-BuAnth), 9,10-bis(4-methyl-1-naphthyl)anthracene (abbreviation: DMNA), 2-tert-butyl-9,10-bis[2-(1-naphthyl)phenyl]anthracene, 9,10-bis[2-(1-naphthyl)phenyl]anthracene, 2,3,6,7-tetramethyl-9,10-di(1-naphthyl)anthracene, 2,3,6,7-tetramethyl-9,10-di(2-naphthyl)anthracene, 9,9'-bianthryl, 10,10'-diphenyl-9,9'-bianthryl, 10,10'-bis(2-phenylphenyl)-9,9'-bianthryl, 10,10'-bis[(2,3,4,5,6-pentaphenyl)phenyl]-9,9'-bianthryl, anthracene, tetracene, rubrene, perylene, 2,5,8,11-tetra(tert-butyl)perylene, and the like are given, for example. In addition to these, pentacene, coronene, or the like can also be used. Such aromatic hydrocarbons having a hole mobility of $1 \times 10^{-6}$ cm$^2$/Vs or higher and having 14 to 42 carbons are more preferred.

Note that the aromatic hydrocarbon may have a vinyl skeleton. As the aromatic hydrocarbon having a vinyl group, 4,4'-bis(2,2-diphenylvinyl)biphenyl (abbreviation: DPVBi), 9,10-bis[4-(2,2-diphenylvinyl)phenyl]anthracene (abbreviation: DPVPA), and the like are given, for example.

Moreover, a high molecular compound such as poly(N-vinylcarbazole) (abbreviation: PVK), poly(4-vinyltriphenylamine) (abbreviation: PVTPA), poly[N-(4-{N'-[4-(4-diphenylamino)phenyl]phenyl-N'-phenylamino}phenyl) methacrylamide] (abbreviation: PTPDMA), or poly[N,N'-bis(4-butylphenyl)-N,N'-bis(phenyl)benzidine] (abbreviation: Poly-TPD) can also be used.

Moreover, as the material having a high hole-transport property, for example, an aromatic amine compound such as 4,4'-bis[N-(1-naphthyl)-N-phenylamino]biphenyl (abbreviation: NPB or α-NPD), N,N'-bis(3-methylphenyl)-N,N'-diphenyl-[1,1'-biphenyl]-4,4'-diamine (abbreviation: TPD), 4,4',4"-tris(carbazol-9-yl)triphenylamine (abbreviation: TCTA), 4,4',4"-tris[N-(1-naphthyl)-N-phenylamino]triphenylamine (abbreviation: 1'-TNATA), 4,4',4"-tris(N,N-diphenylamino)triphenylamine (abbreviation: TDATA), 4,4',4"-tris[N-(3-methylphenyl)-N-phenylamino]triphenylamine (abbreviation: MTDATA), 4,4'-bis[N-(spiro-9,9'-bifluoren-2-yl)-N-phenylamino]biphenyl (abbreviation: BSPB), 4-phenyl-4'-(9-phenylfluoren-9-yl)triphenylamine (abbreviation: BPAFLP), 4-phenyl-3'-(9-phenylfluoren-9-yl)triphenylamine (abbreviation: mBPAFLP), N-(9,9-dimethyl-9H-fluoren-2-yl)-N-{9,9-dimethyl-2-[N'-phenyl-N'-(9,9-dimethyl-9H-fluoren-2-yl)amino]-9H-fluoren-7-yl}phenylamine (abbreviation: DFLADFL), N-(9,9-dimethyl-2-diphenylamino-9H-fluoren-7-yl)diphenylamine (abbreviation: DPNF), 2-[N-(4-diphenylaminophenyl)-N-phenylamino]spiro-9,9'-bifluorene (abbreviation: DPASF), 4-phenyl-4'-(9-phenyl-9H-carbazol-3-yl)triphenylamine (abbreviation: PCBA1BP), 4,4'-diphenyl-4"-(9-phenyl-9H-carbazol-3-yl)triphenylamine (abbreviation: PCBBi1BP), 4-(1-naphthyl)-4'-(9-phenyl-9H-carbazol-3-yl)triphenylamine (abbreviation: PCBANB), 4,4'-di(1-naphthyl)-4"-(9-phenyl-9H-carbazol-3-yl)triphenylamine (abbreviation: PCBNBB), 4-phenyldiphenyl-(9-phenyl-9H-carbazol-3-yl) amine (abbreviation: PCA1BP), N,N'-bis(9-phenylcarbazol-3-yl)-N,N'-diphenylbenzene-1,3-diamine (abbreviation: PCA2B), N,N',N"-triphenyl-N,N',N"-tris(9-phenylcarbazol-3-yl)benzene-1,3,5-triamine (abbreviation: PCA3B), N-(4-biphenyl)-N-(9,9-dimethyl-9H-fluoren-2-yl)-9-phenyl-9H-carbazol-3-amine (abbreviation: PCBiF), N-(1,1'-biphenyl-4-yl)-N-[4-(9-phenyl-9H-carbazol-3-yl)phenyl]-9,9-dimethyl-9H-fluoren-2-amine (abbreviation: PCBBiF), 9,9-dimethyl-N-phenyl-N-[4-(9-phenyl-9H-carbazol-3-yl) phenyl]fluoren-2-amine (abbreviation: PCBAF), N-phenyl-N-[4-(9-phenyl-9H-carbazol-3-yl)phenyl]spiro-9,9'-bifluoren-2-amine (abbreviation: PCBASF), 2-[N-(9-phenylcarbazol-3-yl)-N-phenylamino]spiro-9,9'-bifluorene (abbreviation: PCASF), 2,7-bis[N-(4-diphenylaminophenyl)-N-phenylamino]-spiro-9,9'-bifluorene (abbreviation: DPA2SF), N-[4-(9H-carbazol-9-yl)phenyl]-N-(4-phenyl) phenylaniline (abbreviation: YGA1BP), or N,N'-bis[4-(carbazol-9-yl)phenyl]-N,N'-diphenyl-9,9-dimethylfluorene-2,7-diamine (abbreviation: YGA2F), or the like can be used. Moreover, amine compounds, carbazole compounds, thiophene compounds, furan compounds, fluorene compounds, triphenylene compounds, phenanthrene compounds, and the like such as 3-[4-(1-naphthyl)-phenyl]-9-phenyl-9H-carbazole (abbreviation: PCPN), 3-[4-(9-phenanthryl)-phenyl]-9-phenyl-9H-carbazole (abbreviation: PCPPn), 3,3'-bis(9-phenyl-9H-carbazole) (abbreviation: PCCP), 1,3-bis(N-carbazolyl)benzene (abbreviation: mCP), 3,6-bis(3,5-diphenylphenyl)-9-phenylcarbazole (abbreviation: CzTP), 3,6-di(9H-carbazol-9-yl)-9-phenyl-9H-carbazole (abbreviation: PhCzGI), 2,8-di(9H-carbazol-9-yl)-dibenzothiophene (abbreviation: Cz2DBT), 4-{3-[3-(9-phenyl-9H-fluoren-9-yl)phenyl]phenyl}dibenzofuran (abbreviation: mmDBFFLBi-II), 4,4',4"-(benzene-1,3,5-triyl)tri(dibenzofuran) (abbreviation: DBF3P-II), 1,3,5-tri(dibenzothiophen-4-yl)-benzene (abbreviation: DBT3P-II), 2,8-diphenyl-4-[4-(9-phenyl-9H-fluoren-9-yl)phenyl]dibenzothiophene (abbreviation: DBTFLP-III), 4-[4-(9-phenyl-9H-fluoren-9-yl)phenyl]-6-phenyldibenzothiophene (abbreviation: DBTFLP-IV), and 4-[3-(triphenylen-2-yl)phenyl]dibenzothiophene (abbreviation: mDBTPTp-II), or the like can be used. The substances described here are mainly substances having a hole mobility of $1 \times 10^{-6}$ cm$^2$/Vs or higher. However, other than these, any substance in which the transport property of holes is higher than that of electrons may be used.

As the electron-transport material, a material in which the transport property of electrons is higher than that of holes can be used, and a material having an electron mobility of $1 \times 10^{-6}$ cm$^2$/Vs or higher is preferred. A π-electron deficient type heteroaromatic such as a nitrogen-containing heteroaromatic compound, a metal complex, or the like can be used as the material that easily accepts electrons (the material having an electron-transport property). Specifically, a zinc- or aluminum-based metal complex having a quinoline ligand, a benzoquinoline ligand, an oxazole ligand, or a thiazole ligand, an oxadiazole derivative, a triazole derivative, an imidazole derivative, a phenanthroline derivative, a pyridine derivative, a bipyridine derivative, a pyrimidine derivative, a triazine derivative, and the like are given.

For example, the layer is formed of a metal complex having a quinoline skeleton or a benzoquinoline skeleton such as tris(8-quinolinolato)aluminum(III) (abbreviation: Alq), tris(4-methyl-8-quinolinolato)aluminum(III) (abbreviation: Almq$_3$), bis(10-hydroxybenzo[h]quinolinato)beryllium(II) (abbreviation: BeBq$_2$), bis(2-methyl-8-quinolinolato)(4-phenylphenolato)aluminum(III) (abbreviation: BAlq), or bis(8-quinolinolato)zinc(II) (abbreviation: Znq) or the like. Moreover, other than these, a metal complex having an oxazole-based or thiazole-based ligand, such as bis[2-(2-benzoxazolyl)phenolato]zinc(II) (abbreviation: ZnPBO) or bis[2-(2-benzothiazolyl)phenolato]zinc(II) (abbreviation: ZnBTZ), or the like can also be used. Furthermore, other than metal complexes, the following can be used: heterocyclic compounds such as 2-(4-biphenylyl)-5-(4-tert-butylphenyl)-1,3,4-oxadiazole (abbreviation: PBD), 1,3-bis[5-(p-tert-butylphenyl)-1,3,4-oxadiazol-2-yl]benzene (abbreviation: OXD-7), 9-[4-(5-phenyl-1,3,4-oxadiazol-2-yl)phenyl]-9H-carbazole (abbreviation: CO11), 3-(4-biphenylyl)-4-phenyl-5-(4-tert-butylphenyl)-1,2,4-triazole (abbreviation: TAZ), 9-[4-(4,5-diphenyl-4H-1,2,4-triazol-3-yl)phenyl]-9H-carbazole (abbreviation: CzTAZ1), 2,2',2"-(1,3,5-benzenetriyl)tris(1-phenyl-1H-benzimidazole) (abbreviation: TPBI), 2-[3-(dibenzothiophen-4-yl)phenyl]-1-phenyl-1H-benzimidazole (abbreviation: mDBTBIm-II), bathophenanthroline (abbreviation: BPhen), and bathocuproine (abbreviation: BCP); heterocyclic compounds having a diazine skeleton such as 2-[3-(dibenzothiophen-4-yl)phenyl]dibenzo[f,h]quinoxaline (abbreviation: 2mDBTPDBq-II), 2-[3'-(dibenzothiophen-4-yl)biphenyl-3-yl]dibenzo[f,h]quinoxaline (abbreviation: 2mDBTBPDB q-II), 2-[3'-(9H-carbazol-9-yl)biphenyl-3-yl]dibenzo[f,h]quinoxaline (abbreviation: 2mCzBPDBq), 2-[4-(3,6-diphenyl-9H-carbazol-9-yl)phenyl]dibenzo[f,h]quinoxaline (abbreviation: 2CzPDBq-III), 7-[3-(dibenzothiophen-4-yl)phenyl]dibenzo[f,h]quinoxaline (abbreviation: 7mDBTPDBq-II), and 6-[3-(dibenzothiophen-4-yl)phenyl]dibenzo[f,h]quinoxaline (abbreviation: 6mDBTPDBq-II), 2-[3-(3,9'-bi-9H-carbazol-9-yl)phenyl]dibenzo[f,h]quinoxaline (abbreviation: 2mCzCzPDBq), 4,6-bis[3-(phenanthren-9-yl)phenyl]pyrimidine (abbreviation: 4,6mPnP2Pm), 4,6-bis[3-(4-dibenzothienyl)phenyl]pyrimidine (abbreviation: 4,6mDBTP2Pm-II), and 4,6-bis[3-(9H-carbazol-9-yl)phenyl]pyrimidine (abbreviation: 4,6mCzP2Pm); heterocyclic compounds having a triazine skeleton such as PCCzPTzn; heterocyclic compounds having a pyridine skeleton such as 3,5-bis[3-(9H-carbazol-9-yl)phenyl]pyridine (abbreviation: 35DCzPPy) and 1,3,5-tri[3-(3-pyridyl)phenyl]benzene (abbreviation: TmPyPB); and heteroaromatic compounds such as 4,4'-bis(5-methylbenzoxazol-2-yl)stilbene (abbreviation: BzOs). Among the above-described heterocyclic compounds, the heterocyclic compounds having diazine (pyrimidine, pyrazine, pyridazine) skeletons or having a pyridine skeleton are preferred because of their stability and good reliability. Moreover, the heterocyclic compounds having the skeletons have a high electron-transport property to contribute to a reduction in driving voltage. Moreover, a high molecular compound such as poly(2,5-pyridinediyl) (abbreviation: PPy), poly[(9,9-dihexylfluorene-2,7-diyl)-co-(pyridine-3,5-diyl)] (abbreviation: PF-Py), or poly[(9,9-dioctylfluorene-2,7-diyl)-co-(2,2'-bipyridine-6,6'-diyl)] (abbreviation: PF-BPy) can also be used. The substances described here are mainly substances having an electron mobility of $1 \times 10^{-6}$ cm$^2$/Vs or higher. Note that other than the above substances, any substance in which the transport property of electrons is higher than that of holes may be used.

Note that the purification method described in Embodiment 1 is particularly suitable for a substance including at least one of an aromatic amine skeleton or a π-electron rich type heteroaromatic ring skeleton among the substances given above. In particular, a triarylamine skeleton is preferably included as an aromatic amine skeleton. Moreover, a pyrrole skeleton is preferably included as a π-electron rich type heteroaromatic ring skeleton. Moreover, a carbazole skeleton is preferably included as a pyrrole skeleton.

As the host material 432, a combination of two kinds of compounds which can form an exciplex may be used. In this case, it is preferable that the host material 432 and the guest material 431 (phosphorescent compound) be selected such that the emission peak of the exciplex overlaps with an absorption band, specifically an absorption band on the longest wavelength side, of triplet MLCT (Metal to Ligand Charge Transfer) transition of the guest material 431 (phosphorescent compound). This enables a light-emitting element with drastically improved emission efficiency. Note that in the case where a thermally activated delayed fluorescent compound is used instead of the phosphorescent compound, it is preferable that the absorption band on the longest wavelength side be a singlet absorption band.

Note that the light-emitting layer 430 can also be composed of a plurality of layers of two or more layers. For example, in the case where a first light-emitting layer and a second light-emitting layer are stacked in this order from the hole-transport layer side to form the light-emitting layer 430, there are a structure in which a substance having a hole-transport property is used as the host material of the first light-emitting layer and a substance having an electron-transport property is used as the host material of the second light-emitting layer, and the like.

Moreover, the light-emitting layer 430 may contain a material other than the guest material 431 and the host material 432.

Note that the light-emitting layer 430 can be formed by a method such as a vapor deposition method (including a vacuum vapor deposition method), an inkjet method, a coating method, or gravure printing. Besides the above-described materials, an inorganic compound such as a quantum dot or a high molecular compound (an oligomer, a dendrimer, a polymer, or the like) may be included.

Note that as a quantum dot, a colloidal quantum dot, an alloyed quantum dot, a core-shell quantum dot, a core quantum dot, or the like may be used. Moreover, a quantum dot containing an element group of Group 2 and Group 16, Group 13 and Group 15, Group 13 and Group 17, Group 11 and Group 17, or Group 14 and Group 15 may be used. Alternatively, a quantum dot including an element such as cadmium (Cd), selenium (Se), zinc (Zn), sulfur (S), phosphorus (P), indium (In), tellurium (Te), lead (Pb), gallium (Ga), arsenic (As), or aluminum (Al) may be used.

As a liquid medium used for a wet process, for example, an organic solvent of ketones such as methyl ethyl ketone and cyclohexanone, fatty acid esters such as ethyl acetate, halogenated hydrocarbons such as dichlorobenzene, aromatic hydrocarbons such as toluene, xylene, mesitylene, and cyclohexylbenzene, aliphatic hydrocarbons such as cyclohexane, decalin, and dodecane, dimethylformamide (DMF), or dimethyl sulfoxide (DMSO) can be used.

《Hole-Injection Layer》

The hole-injection layer 411 has a function of reducing a barrier for hole injection from one of the pair of electrodes (the electrode 401 or the electrode 402) to promote hole injection and is formed of a transition metal oxide, a phthalocyanine derivative, an aromatic amine, or the like, for example. As the transition metal oxide, molybdenum oxide, vanadium oxide, ruthenium oxide, tungsten oxide, manganese oxide, and the like are given. As the phthalocyanine derivative, phthalocyanine, metal phthalocyanine, and the like are given. As the aromatic amine, a benzidine derivative, a phenylenediamine derivative, and the like are given. It is also possible to use a high molecular compound such as polythiophene or polyaniline; a typical example thereof is poly(ethylenedioxythiophene)/poly(styrenesulfonic acid), which is self-doped polythiophene, or the like.

As the hole-injection layer 411, a layer including a composite material of a hole-transport material and a material exhibiting an electron accepting property for this can also be used. Alternatively, stacked layers of a layer containing a material exhibiting an electron accepting property and a layer containing a hole-transport material may be used. In a steady state or in the presence of an electric field, electric charge can be transferred between these materials. As the material exhibiting an electron accepting property, organic acceptors such as a quinodimethane derivative, a chloranil derivative, and a hexaazatriphenylene derivative can be given. Specifically, the material is a compound having an electron-withdrawing group (a halogen group or a cyano group), such as 7,7,8,8-tetracyano-2,3,5,6-tetrafluoroquinodimethane (abbreviation: $F_4$-TCNQ), chloranil, or 2,3,6,7,10,11-hexacyano-1,4,5,8,9,12-hexaazatriphenylene (abbreviation: HAT-CN). Moreover, a transition metal oxide such as an oxide of a metal from Group 4 to Group 8 can be used, which is specifically vanadium oxide, niobium oxide, tantalum oxide, chromium oxide, molybdenum oxide, tungsten oxide, manganese oxide, rhenium oxide, or the like. In particular, molybdenum oxide is preferred because it is stable in the air, has a low hygroscopic property, and is easily handled.

As the hole-transport material, a material in which the transport property of holes is higher than that of electrons can be used and a material having a hole mobility of $1 \times 10^{-6}$ cm$^2$/Vs or higher is preferred. Specifically, the aromatic amine, carbazole derivative, aromatic hydrocarbon, stilbene derivative, and the like given as the hole-transport material which can be used in the light-emitting layer 430 can be used. Moreover, the hole-transport material may be a high molecular compound.

《Hole-Transport Layer》

The hole-transport layer 412 is a layer containing a hole-transport material and the hole-transport materials given as examples of the material of the hole-injection layer 411 can be used. In order to have a function of transporting holes injected into the hole-injection layer 411 to the light-emitting layer 430, the hole-transport layer 412 preferably has a HOMO level equal or close to the highest occupied molecular orbital (Highest Occupied Molecular Orbital, also referred to as HOMO) level of the hole-injection layer 411.

Moreover, a substance having a hole mobility of $1 \times 10^{-6}$ cm$^2$/Vs or higher is preferred. However, other than these, any substance in which the transport property of holes is higher than that of electrons may be used. Note that the layer containing a substance having a high hole-transport property is not limited to a single layer, and two or more layers formed of the above substances may be stacked.

《Electron-Transport Layer》

The electron-transport layer 418 has a function of transporting, to the light-emitting layer 430, electrons injected from the other of the pair of electrodes (the electrode 401 or the electrode 402) through the electron-injection layer 419. As the electron-transport material, a material in which the transport property of electrons is higher than that of holes can be used and a material having an electron mobility of $1 \times 10^{-6}$ cm$^2$/Vs or higher is preferred. As the compound which easily accepts electrons (the material having an electron-transport property), a π-electron deficient type heteroaromatic such as a nitrogen-containing heteroaromatic compound, a metal complex, or the like can be used. Specifically, a metal complex having a quinoline ligand, a benzoquinoline ligand, an oxazole ligand, or a thiazole ligand, which is given as the electron-transport material which can be used in the light-emitting layer 430, an oxadiazole derivative, a triazole derivative, a phenanthroline derivative, a pyridine derivative, a bipyridine derivative, a pyrimidine derivative, and the like are given. Moreover, a substance having an electron mobility of $1 \times 10^{-6}$ cm$^2$/Vs or higher is preferred. Note that other than the above substances, any substance in which the transport property of electrons is higher than that of holes may be used for the electron-transport layer. Moreover, the electron-transport layer 418 is not limited to a single layer, and two or more layers formed of the above substances may be stacked.

Moreover, between the electron-transport layer 418 and the light-emitting layer 430, a layer that controls transfer of electron carriers may be provided. The layer is a layer in which a small amount of a substance having a high electron-trapping property is added to a material having a high electron-transport property described above, and control of transfer of electron carriers enables adjustment of carrier balance. Such a structure is very effective in inhibiting a problem (e.g., a reduction in element lifetime) caused when electrons pass through the light-emitting layer.

Moreover, an n-type compound semiconductor may be used. For example, an oxide such as titanium oxide ($TiO_2$), zinc oxide (ZnO), silicon oxide ($SiO_2$), tin oxide ($SnO_2$), tungsten oxide ($WO_3$), tantalum oxide ($Ta_2O_3$), barium titanate ($BaTiO_3$), barium zirconate ($BaZrO_3$), zirconium oxide ($ZrO_2$), hafnium oxide ($HfO_2$), aluminum oxide ($Al_2O_3$), yttrium oxide ($Y_2O_3$), or zirconium silicate ($ZrSiO_4$), a nitride such as silicon nitride ($Si_3N_4$), cadmium sulfide (CdS), zinc selenide (ZnSe), zinc sulfide (ZnS), and the like can also be used.

«Electron-Injection Layer»

The electron-injection layer 419 has a function of reducing a barrier for electron injection from the electrode 402 to promote electron injection, and for example, a Group 1 metal or a Group 2 metal, or an oxide, a halide, or a carbonate of these, or the like can be used. Moreover, a composite material of an electron-transport material described above and a material exhibiting an electron donating property for this can also be used. As the material exhibiting an electron donating property, a Group 1 metal, a Group 2 metal, an oxide of these, or the like can be given. Specifically, an alkali metal, an alkaline earth metal, or a compound thereof, such as lithium fluoride (LiF), sodium fluoride (NaF), cesium fluoride (CsF), calcium fluoride ($CaF_2$), or lithium oxide ($LiO_x$), can be used. Moreover, a rare earth metal compound like erbium fluoride ($ErF_3$) can be used. Moreover, electride may be used for the electron-injection layer 419. As the electride, a substance in which electrons are added at high concentration to a mixed oxide of calcium and aluminum and the like are given. Moreover, the substance that can be used for the electron-transport layer 418 may be used for the electron-injection layer 419.

Moreover, a composite material formed by mixture of an organic compound and an electron donor (donor) may be used for the electron-injection layer 419. Such a composite material is excellent in an electron-injection property and an electron-transport property because electrons are generated in the organic compound by the electron donor. In this case, the organic compound is preferably a material that is excellent in transporting the generated electrons. Specifically, the above-described substances forming the electron-transport layer 418 (the metal complexes, heteroaromatic compounds, and the like) can be used, for example. The electron donor is a substance exhibiting an electron donating property for the organic compound. Specifically, an alkali metal, an alkaline earth metal, and a rare earth metal are preferred, and lithium, sodium, cesium, magnesium, calcium, erbium, ytterbium, and the like are given. Moreover, an alkali metal oxide and an alkaline earth metal oxide are preferred, and lithium oxide, calcium oxide, barium oxide, and the like are given. Moreover, a Lewis base such as magnesium oxide can also be used. Moreover, an organic compound such as tetrathiafulvalene (abbreviation: TTF) can also be used.

Note that the light-emitting layer, the hole-injection layer, the hole-transport layer, the electron-transport layer, and the electron-injection layer described above can each be formed by a method such as a vapor deposition method (including a vacuum vapor deposition method), an inkjet method, a coating method, or gravure printing. Moreover, besides the above-described materials, an inorganic compound such as a quantum dot or a high molecular compound (an oligomer, a dendrimer, a polymer, or the like) may be used in the light-emitting layer, the hole-injection layer, the hole-transport layer, the electron-transport layer, and the electron-injection layer described above.

«Pair of Electrodes»

The electrode 401 and the electrode 402 have a function as an anode or a cathode of the light-emitting element. The electrode 401 and the electrode 402 can be formed using a metal, an alloy, a conductive compound, a mixture or a stack thereof, or the like.

One of the electrode 401 and the electrode 402 is preferably formed of a conductive material having a function of reflecting light. As the conductive material, aluminum (Al), an alloy containing Al, or the like is given. As the alloy containing Al, an alloy containing Al and L (L represents one or more of titanium (Ti), neodymium (Nd), nickel (Ni), and lanthanum (La)), such as an alloy containing Al and Ti or an alloy containing Al, Ni, and La, or the like is given. Aluminum has low resistance and high light reflectivity. Moreover, aluminum exists in large amounts in the earth's crust and is inexpensive; accordingly, it is possible to reduce costs for manufacturing a light-emitting element by using aluminum. Moreover, silver (Ag), an alloy of Ag and N (N represents one or more of yttrium (Y), Nd, magnesium (Mg), ytterbium (Yb), Al, Ti, gallium (Ga), zinc (Zn), indium (In), tungsten (W), manganese (Mn), tin (Sn), iron (Fe), Ni, copper (Cu), palladium (Pd), iridium (Ir), or gold (Au)), or the like may be used. As the alloy containing silver include an alloy containing silver, palladium, and copper, an alloy containing silver and copper, an alloy containing silver and magnesium, an alloy containing silver and nickel, an alloy containing silver and gold, an alloy containing silver and ytterbium, and the like are given. Besides, a transition metal such as tungsten, chromium (Cr), molybdenum (Mo), copper, or titanium can be used.

Moreover, light emitted from the light-emitting layer is extracted through one or both of the electrode 401 and the electrode 402. Thus, at least one of the electrode 401 and the electrode 402 is preferably formed of a conductive material having a function of transmitting light. As the conductive material, a conductive material having a visible light transmittance higher than or equal to 40% and lower than or equal to 100%, preferably higher than or equal to 60% and lower than or equal to 100%, and a resistivity lower than or equal to $1\times10^{-2}$ Ω·cm is given.

Moreover, the electrode 401 and the electrode 402 may be formed of a conductive material having a function of transmitting light and a function of reflecting light. As the conductive material, a conductive material having a visible light reflectivity higher than or equal to 20% and lower than or equal to 80%, preferably higher than or equal to 40% and lower than or equal to 70%, and a resistivity lower than or equal to $1\times10^{-2}$ Ω·cm is given. For example, the electrodes can be formed using one or more kinds of conductive metals and alloys, conductive compounds, and the like. Specifically, a metal oxide such as indium tin oxide (Indium Tin Oxide, hereinafter, referred to as ITO), indium tin oxide containing silicon or silicon oxide (abbreviation: ITSO), indium oxide-zinc oxide (Indium Zinc Oxide), indium oxide-tin oxide containing titanium, indium titanium oxide, or indium oxide containing tungsten oxide and zinc oxide can be used. Moreover, a metal thin film having a thickness that allows transmission of light (preferably, a thickness greater than or equal to 1 nm and less than or equal to 30 nm) can be used. As the metal, for example, Ag, alloys of Ag and Al, Ag and Mg, Ag and Au, Ag and Yb, and the like, or the like can be used.

Note that in this specification and the like, the material having a function of transmitting light is a material that has a function of transmitting visible light and has conductivity. For example, in addition to the above oxide conductor typified by ITO, an oxide semiconductor or an organic conductor containing an organic substance is included. As the organic conductor containing an organic substance, for example, a composite material formed by mixture of an organic compound and an electron donor (a donor), a composite material formed by mixture of an organic compound and an electron acceptor (an acceptor), and the like are given. Moreover, an inorganic carbon-based material such as graphene may be used. Moreover, the resistivity of the material is preferably lower than or equal to $1\times10^5$ Ω·cm, further preferably lower than or equal to $1\times10^4$ Ω·cm.

Moreover, one or both of the electrode 401 and the electrode 402 may be formed by stacking a plurality of the above materials.

Moreover, in contact with the electrode having a function of transmitting light, a material having a higher refractive index than the electrode may be formed in order that light extraction efficiency be improved. Such a material may be a material having conductivity or a material not having conductivity as long as having a function of transmitting visible light. For example, in addition to the above oxide conductor, an oxide semiconductor, an organic substance, and the like are given. As the organic substance, materials given as examples for the light-emitting layer, the hole-injection layer, the hole-transport layer, the electron-transport layer, or the electron-injection layer are given. Moreover, an inorganic carbon-based material or a metal film thin enough to transmit light can also be used. A plurality of layers of these materials having a high refractive index with a thickness of several nanometers to several tens of nanometers may be stacked.

In the case where the electrode 401 or the electrode 402 has a function as a cathode, the electrode preferably includes a material having a low work function (lower than or equal to 3.8 eV). For example, an element belonging to Group 1 or Group 2 of the periodic table (an alkali metal such as lithium, sodium, or cesium, an alkaline earth metal such as calcium or strontium, magnesium, or the like), an alloy containing these elements (e.g., Ag and Mg, Al and Li), a rare earth metal such as europium (Eu) or Yb, an alloy containing these rare earth metals, an alloy containing aluminum and silver, or the like can be used.

Moreover, in the case where the electrode 401 or the electrode 402 is used as an anode, a material having a high work function (higher than or equal to 4.0 eV) is preferably used.

Moreover, the electrode 401 and the electrode 402 may each be a stack of a conductive material having a function of reflecting light and a conductive material having a function of transmitting light. That case is preferred because the electrode 401 and the electrode 402 can have a function of adjusting the optical length so that desired light from each light-emitting layer resonates and is intensified.

As a film formation method of the electrode 401 and the electrode 402, a sputtering method, a vapor deposition method, a printing method, a coating method, an MBE (Molecular Beam Epitaxy) method, a CVD method, a pulsed laser deposition method, an ALD (Atomic Layer Deposition) method, or the like can be used as appropriate.

«Substrate»

The light-emitting element according to one embodiment of the present invention is formed over a substrate of glass, plastic, or the like. As order of fabrication over the substrate, layers may be sequentially stacked from the electrode 401 side or sequentially stacked from the electrode 402 side.

Note that as the substrate over which the light-emitting element according to one embodiment of the present invention can be formed, glass, quartz, plastic, or the like can be used, for example. Moreover, a flexible substrate may be used. The flexible substrate means a substrate that can be bent (flexible), and a plastic substrate made of polycarbonate or polyarylate, and the like are given, for example. Moreover, a film, an inorganic vapor deposition film, or the like can also be used. Note that other than these, what functions as a support in a fabrication process of the light-emitting element and an optical element may be used. Alternatively, what has a function of protecting the light-emitting element and an optical element is used.

In the present invention and the like, a light-emitting element can be formed using a variety of substrates, for example. There is no particular limitation on the type of substrate. Examples of the substrate include a semiconductor substrate (e.g., a single crystal substrate or a silicon substrate), an SOI substrate, the glass substrate, a quartz substrate, a plastic substrate, a metal substrate, a stainless steel substrate, a substrate including stainless steel foil, a tungsten substrate, a substrate including tungsten foil, a flexible substrate, an attachment film, cellulose nanofiber (CNF) and paper which contain a fibrous material, a base material film, and the like. As an example of a glass substrate, barium borosilicate glass, aluminoborosilicate glass, soda lime glass, and the like are given. Examples of the flexible substrate, the attachment film, the base material film, and the like are as follows: for example, plastics typified by polyethylene terephthalate (PET), polyethylene naphthalate (PEN), polyether sulfone (PES), and polytetrafluoroethylene (PTFE). Alternatively, an example is a resin such as acrylic and the like. Alternatively, examples are polypropylene, polyester, polyvinyl fluoride, and polyvinyl chloride. Alternatively, examples are polyamide, polyimide, aramid, epoxy, an inorganic vapor deposition film, paper, and the like.

Moreover, a flexible substrate may be used as the substrate such that the light-emitting element is provided directly on the flexible substrate. Alternatively, a separation layer may be provided between the substrate and the light-emitting element. After part or the whole of the light-emitting element is completed over it, the separation layer can be used for separation from the substrate and transfer to another substrate. At that time, the light-emitting element can be transferred to a substrate having poor heat resistance or a flexible substrate as well. Note that for the above separation layer, a stack structure including inorganic films, which are a tungsten film and a silicon oxide film, a structure in which a resin film of polyimide or the like is formed over a substrate, or the like can be used, for example.

In other words, after the light-emitting element is formed using a certain substrate, the light-emitting element may then be transferred to another substrate so that the light-emitting element is placed on another substrate. Examples of the substrate to which the light-emitting element is transferred are, in addition to the above substrates, a cellophane substrate, a stone substrate, a wood substrate, a cloth substrate (including a natural fiber (silk, cotton, hemp), a synthetic fiber (nylon, polyurethane, polyester), a regenerated fiber (including acetate, cupra, rayon, regenerated polyester), and the like), a leather substrate, a rubber substrate, and the like. When such a substrate is used, the light-emitting element can be a light-emitting element that is less likely to be damaged, a light-emitting element having high heat resistance, a light-emitting element with reduced weight, or a light-emitting element with reduced thickness.

Moreover, a field-effect transistor (FET), for example, is formed over the above-described substrate, and the light-emitting element 450 may be fabricated over an electrode electrically connected to the FET. Accordingly, an active matrix type display device in which the FET controls the driving of the light-emitting element 450 can be fabricated.

The structure described above in this embodiment can be combined with the structures described in the other embodiments as appropriate.

Embodiment 3

This embodiment shows an example of a mode where the substance purified by the purification method described in Embodiment 1 is used for an active layer of a vertical transistor (a static induction transistor: SIT), which is a kind of an organic semiconductor element.

Figure 7:
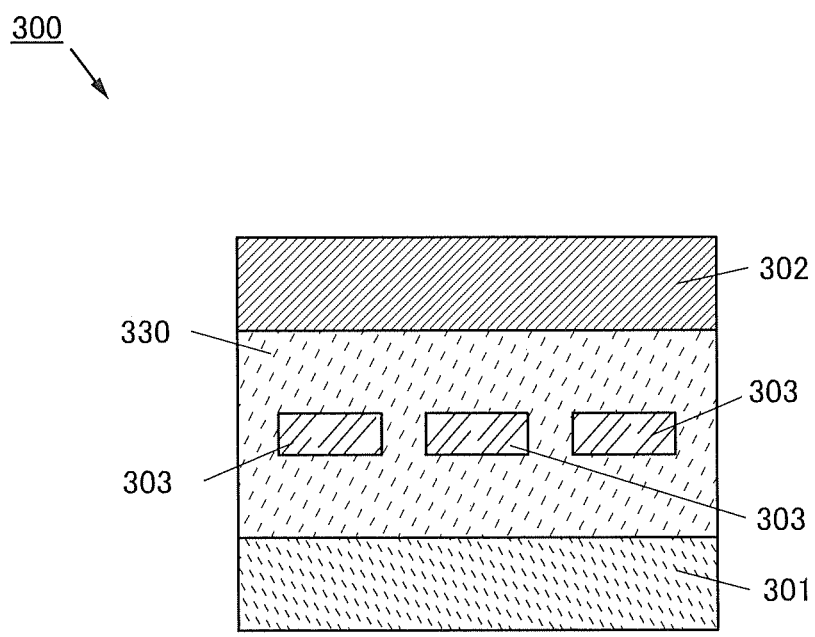
FIG. 7 A schematic cross-sectional view of a semiconductor element according to one embodiment of the present invention.

In an element structure, an active layer 330 in the form of a thin film is sandwiched between a source electrode 301 and a drain electrode 302 and gate electrodes 303 are embedded in the active layer 330, as shown in FIG. 7. The gate electrodes 303 are electrically connected to a means for applying a gate voltage, and the source electrode 301 and the drain electrode 302 are electrically connected to a means for controlling a voltage between the source electrode-drain electrode. Note that the functions of the source electrode and the drain electrode may be replaced with each other.

In such an element structure, when a voltage is applied between the source electrode-drain electrode in a state without applying a voltage to the gate electrodes 303, a current flows (brought into an ON state). Then, when a voltage is applied to the gate electrodes 303 in that state, a depletion layer is generated in the periphery of the gate electrodes 303, so that the current ceases flowing (brought into an OFF state). With such a mechanism, an organic semiconductor element 300 operates as a transistor.

In a vertical transistor, a substance with a high purity is required for an active layer as in a light-emitting element, and a substance that sufficiently meets the requirement can be provided by the purification method described in Embodiment 1.

Note that the structure described in this embodiment can be combined as appropriate with the structures described in the other embodiments.

Embodiment 4

Figure 8A:
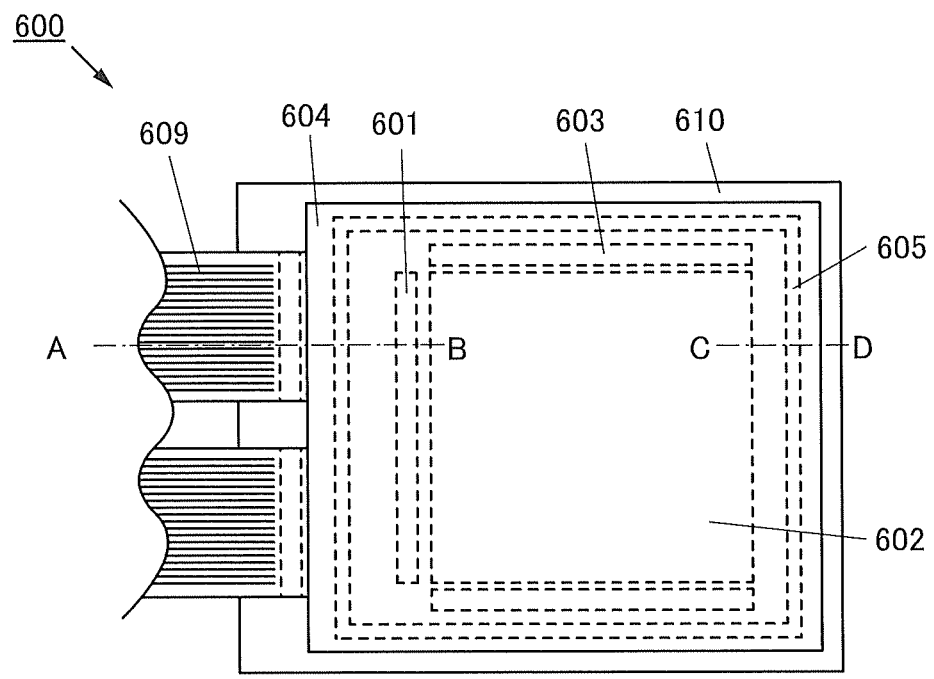
FIG. 8 A top view and a schematic cross-sectional view illustrating a display device according to one embodiment of the present invention.

In this embodiment, a display device of one embodiment of the present invention is described using FIGS. 8(A) and (B).

Figure 8B:
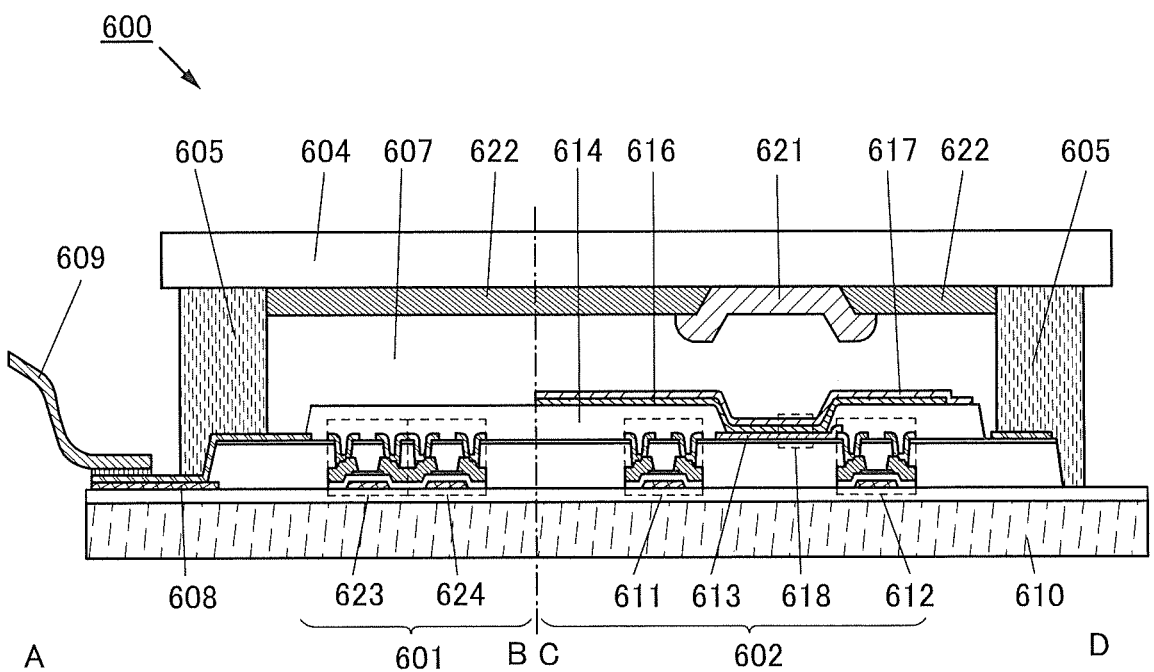

FIG. 8(A) is a top view showing a display device 600 and FIG. 8(B) is a cross-sectional view taken along the dashed-dotted line A-B and the dashed-dotted line C-D in FIG. 8(A). The display device 600 includes driver circuit portions (a signal line driver circuit portion 601 and a scan line driver circuit portion 603) and a pixel portion 602. Note that the signal line driver circuit portion 601, the scan line driver circuit portion 603, and the pixel portion 602 have a function of controlling light emission from a light-emitting element.

Moreover, the display device 600 also includes an element substrate 610, a sealing substrate 604, a sealing material 605, a region 607 surrounded by the sealing material 605, a lead wiring 608, and an FPC 609.

Note that the lead wiring 608 is a wiring for transmitting signals to be input to the signal line driver circuit portion 601 and the scan line driver circuit portion 603 and receives a video signal, a clock signal, a start signal, a reset signal, and the like from the FPC 609 serving as an external input terminal. Although only the FPC 609 is shown in the figure, the FPC 609 may be provided with a printed wiring board (PWB: Printed Wiring Board).

Moreover, in the signal line driver circuit portion 601, a CMOS circuit in which an N-channel transistor 623 and a P-channel transistor 624 are combined is formed. Note that in the signal line driver circuit portion 601 or the scan line driver circuit portion 603, a field-effect transistor (FET), for example, which is formed over the above-described substrate types of circuits such as a CMOS circuit, a PMOS circuit, or an NMOS circuit can be used. Moreover, although the display device with a driver in which a driver circuit portion is formed and a pixel are formed over the same surface of a substrate is shown in this embodiment, but it is not necessarily required and the driver circuit portion can be formed not over the substrate but the outside.

Moreover, the pixel portion 602 includes a switching transistor 611, a current control transistor 612, and a lower electrode 613 electrically connected to a drain of the current control transistor 612. Note that a partition wall 614 is formed to cover end portions of the lower electrode 613. As the partition wall 614, a positive type photosensitive acrylic resin film can be used.

Moreover, in order to make coverage favorable, the partition wall 614 is formed to have a curved surface with curvature at its upper end portion or lower end portion. For example, in the case where a positive type photosensitive acrylic as a material of the partition wall 614 is used, it is preferable that only the upper end portion of the partition wall 614 have a curved surface with a radius of curvature (greater than or equal to 0.2 μm and less than or equal to 3 μm). Moreover, as the partition wall 614, either a negative type photosensitive resin or a positive type photosensitive resin can be used.

Note that there is no particular limitation on structures of the transistors (transistors 611, 612, 623, 624). For example, a staggered transistor may be used. Moreover, there is no particular limitation on the polarity of these transistors, and a structure including N-channel and P-channel transistors and a structure consisting of either N-channel transistors or P-channel transistors may be used. Moreover, there is no particular limitation on the crystallinity of a semiconductor film used for these transistors. For example, an amorphous semiconductor film or a crystalline semiconductor film can be used. As examples of a semiconductor material, Group 14 (silicon and the like) semiconductors, compound semiconductors (including oxide semiconductors), organic semiconductors, and the like can be used. For example, it is preferable to use an oxide semiconductor that has an energy gap of 2 eV or more, preferably 2.5 eV or more and further preferably 3 eV or more, for the transistors, because the off-state current of the transistors can be reduced. As examples of the oxide semiconductor, an In—Ga oxide, an In-M-Zn oxide (M represents aluminum (Al), gallium (Ga), yttrium (Y), zirconium (Zr), lanthanum (La), cerium (Ce), tin (Sn), hafnium (Hf), or neodymium (Nd)), and the like are given.

An EL layer 616 and an upper electrode 617, are each formed over the lower electrode 613. Note that the lower electrode 613 functions as an anode and the upper electrode 617 functions as a cathode.

Moreover, the EL layer 616 is formed by a variety of methods such as a vapor deposition method with a vapor deposition mask (including a vacuum vapor deposition method), a droplet discharging method (also referred to as an inkjet method), a coating method such as a spin coating method, or a gravure printing method. Moreover, a material forming the EL layer 616 may be a low molecular compound or a high molecular compound (including an oligomer, a dendrimer).

Note that a light-emitting element 618 is formed with the lower electrode 613, the EL layer 616, and the upper electrode 617. The light-emitting element 618 preferably has the structures described in Embodiment 2.

Moreover, the sealing substrate 604 and the element substrate 610 are attached to each other with the sealing material 605, which is a structure in which the light-emitting element 618 is included in the region 607 surrounded by the element substrate 610, the sealing substrate 604, and the sealing material 605. Note that the region 607 is filled with a filler. In some cases, the region 607 is filled with an inert gas (nitrogen, argon, or the like) or filled with an ultraviolet curable resin or a thermosetting resin which can be used for the sealing material 605. For example, a PVC (polyvinyl chloride)-based resin, an acrylic-based resin, a polyimide-based resin, an epoxy-based resin, a silicone-based resin, a PVB (polyvinyl butyral)-based resin, or an EVA (ethylene vinyl acetate)-based resin can be used. If the sealing substrate is provided with a recessed portion and a desiccant is provided therein, deterioration due to influence of moisture can be inhibited, which is a preferable structure.

Moreover, an optical element 621 is provided below the sealing substrate 604 to overlap with the light-emitting element 618. Moreover, a light-blocking layer 622 is provided below the sealing substrate 604. The provision of a coloring layer (color filter), a polarizing plate, an antireflection film, or the like, for example, as the optical element 621 can increase the color purity or contrast ratio of the display device 600 and can reduce reflection of the outside light. Moreover, the use of a metal, a resin containing black pigment, carbon black, a metal oxide, a composite oxide containing a solid solution of a plurality of metal oxides, or the like for the light-blocking layer 622 can prevent reflection of the outside light and color mixture of light emitted from an adjacent light-emitting element.

Note that an epoxy-based resin or glass frit is preferably used for the sealing material 605. It is desirable that such a material do not transmit moisture or oxygen as much as possible. As a material used for the sealing substrate 604, other than a glass substrate and a quartz substrate, a plastic substrate formed of FRP (Fiber Reinforced Plastic), PVF (polyvinyl fluoride), polyester, acrylic, or the like can be used.

As described above, the display device including the light-emitting element described in Embodiment 2 can be obtained.

Note that the structures described in this embodiment can be combined as appropriate with the other structures in the other embodiments and this embodiment.

Embodiment 5

Figure 9:
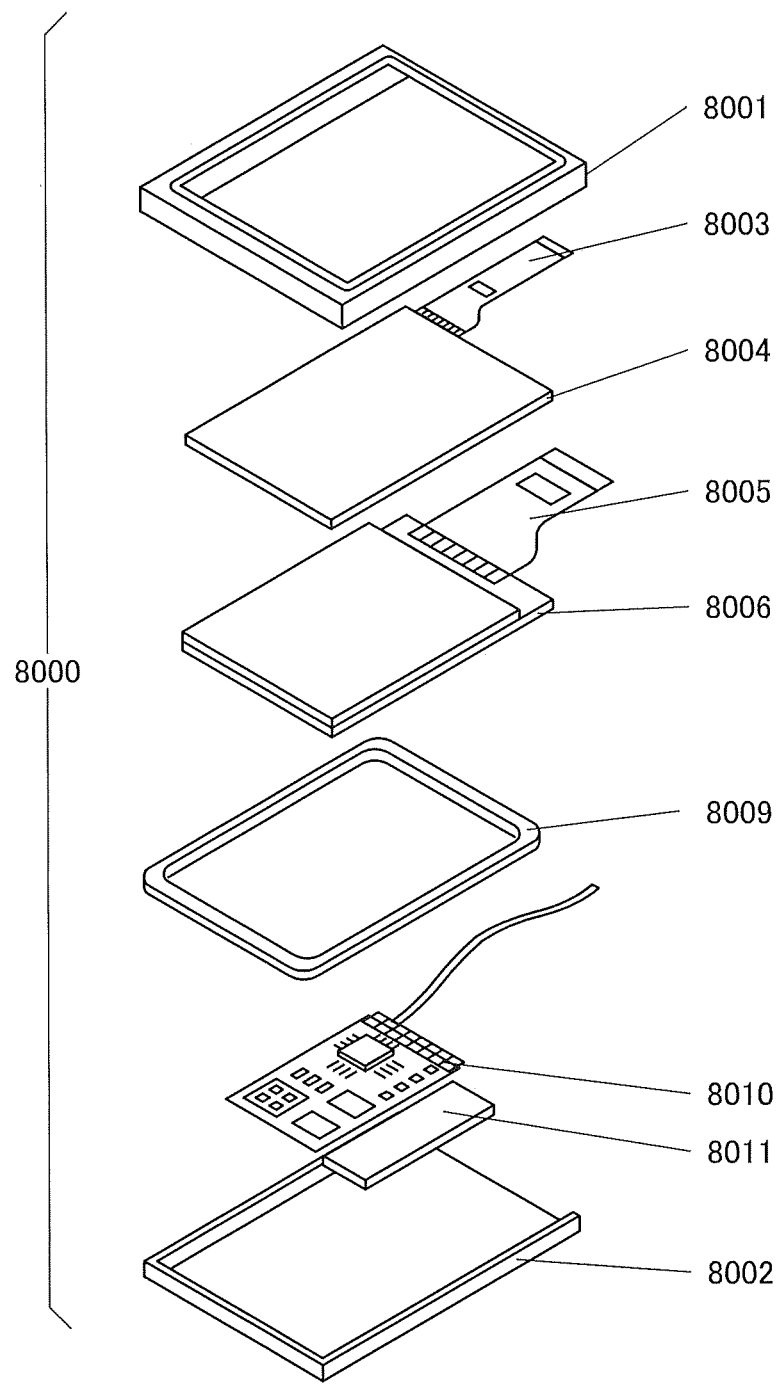
FIG. 9 A perspective view illustrating a display module according to one embodiment of the present invention.

In this embodiment, a display module including a light-emitting element of one embodiment of the present invention is described using FIG. 9.

A display module 8000 shown in FIG. 9 includes a touch sensor 8004 connected to an FPC 8003, a display device 8006 connected to an FPC 8005, a frame 8009, a printed board 8010, and a battery 8011, between an upper cover 8001 and a lower cover 8002.

The light-emitting element of one embodiment of the present invention can be used for the display device 8006, for example.

The shapes and sizes of the upper cover 8001 and the lower cover 8002 can be changed as appropriate in accordance with the sizes of the touch sensor 8004 and the display device 8006.

As the touch sensor 8004, a resistance film type or capacitive type touch sensor can be used to overlap with the display device 8006. Moreover, a counter substrate (sealing substrate) of the display device 8006 can have a touch sensor function. Moreover, a photosensor may be provided in each pixel of the display device 8006 to form an optical touch sensor.

The frame 8009 has a function as an electromagnetic shield for blocking electromagnetic waves generated by the operation of the printed board 8010, besides a function of protecting the display device 8006. Moreover, the frame 8009 may have a function as a radiator plate.

The printed board 8010 includes a power supply circuit and a signal processing circuit for outputting a video signal and a clock signal. A power source for supplying power to the power supply circuit may be an external commercial power source or a power source using the battery 8011 provided separately. The battery 8011 can be omitted in the case where a commercial power source is used.

Furthermore, the display module 8000 may be additionally provided with a member such as a polarizing plate, a retardation plate, or a prism sheet.

The structure described in this embodiment can be used in combination with the structures described in the other embodiments as appropriate.

Embodiment 6

Figure 10A:
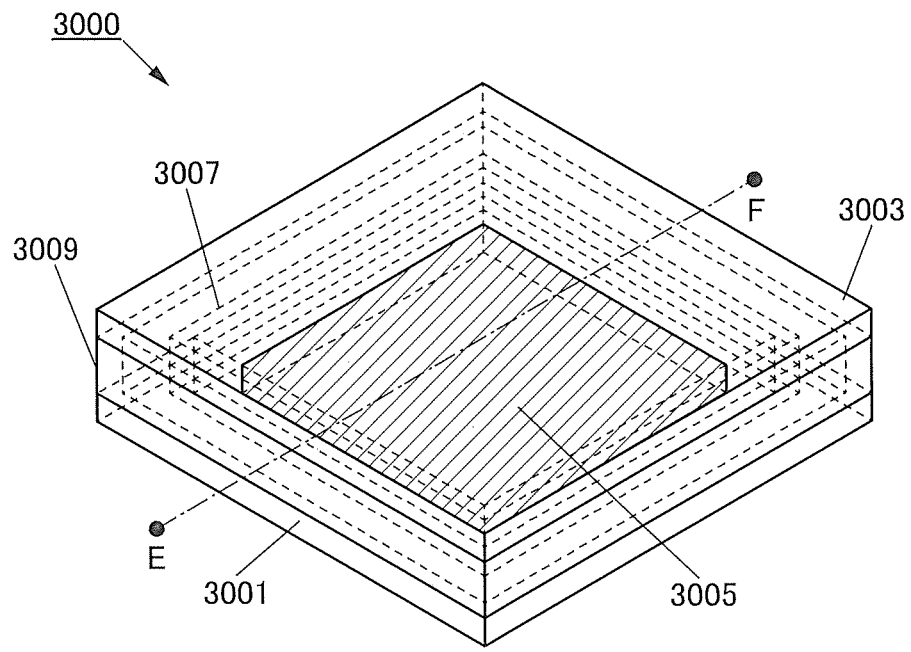
FIG. 10 A perspective view and cross-sectional views illustrating a light-emitting device according to one embodiment of the present invention.

In this embodiment, a light-emitting device including the light-emitting element of one embodiment of the present invention is described using FIGS. 10(A), (B), and (C).

Figure 10B:
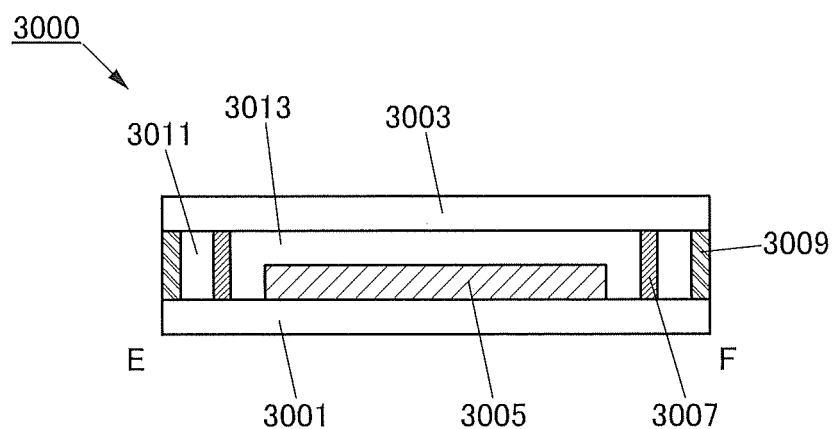

FIG. 10(A) is a perspective view of a light-emitting device 3000 shown in this embodiment, and FIG. 10(B) is a cross-sectional view taken along the dashed-dotted line E-F in FIG. 10(A). Note that in FIG. 10(A), some components are indicated by broken lines in order to avoid complexity of the figure.

The light-emitting device 3000 shown in FIGS. 10(A) and (B) includes a substrate 3001, a light-emitting element 3005 over the substrate 3001, a first sealing region 3007 provided around the light-emitting element 3005, and a second sealing region 3009 provided around the first sealing region 3007.

Moreover, light is emitted from the light-emitting element 3005 through one or both of the substrate 3001 and a substrate 3003. In FIGS. 10(A) and (B), a structure in which light is emitted from the light-emitting element 3005 to the lower side (the substrate 3001 side) is illustrated.

Moreover, as shown in FIGS. 10(A) and (B), the light-emitting device 3000 has a double sealing structure in which the light-emitting element 3005 is surrounded by the first sealing region 3007 and the second sealing region 3009. With the double sealing structure, entry of impurities (e.g., water, oxygen, and the like) from the outside into the light-emitting element 3005 side can be favorably inhibited. However, the first sealing region 3007 and the second sealing region 3009 are not necessarily provided. For example, a structure of only the first sealing region 3007 may be formed.

Note that in FIG. 10(B), the first sealing region 3007 and the second sealing region 3009 are provided in contact with the substrate 3001 and the substrate 3003. However, without limitation to this, for example, a structure in which one or both of the first sealing region 3007 and the second sealing region 3009 are provided in contact with an insulating film or a conductive film formed above the substrate 3001 may be formed. Alternatively, a structure in which one or both of the first sealing region 3007 and the second sealing region 3009 are provided in contact with an insulating film or a conductive film formed below the substrate 3003 may be formed.

The substrate 3001 and the substrate 3003 have structures similar to the respective substrates described in the above embodiment. The light-emitting element 3005 has a structure similar to the light-emitting element described in the above embodiments.

For the first sealing region 3007, a material containing glass (e.g., glass frit, a glass ribbon, and the like) is used. Moreover, for the second sealing region 3009, a material containing a resin is used. With the use of the material containing glass for the first sealing region 3007, productivity and a sealing property can be increased. Moreover, with the use of the material containing a resin for the second sealing region 3009, impact resistance and heat resistance can be increased. However, the first sealing region 3007 and the second sealing region 3009 are not limited to such, and the first sealing region 3007 may be formed using the material containing a resin and the second sealing region 3009 may be formed using the material containing glass.

Moreover, the above-described glass frit may contain, for example, magnesium oxide, calcium oxide, strontium oxide, barium oxide, cesium oxide, sodium oxide, potassium oxide, boron oxide, vanadium oxide, zinc oxide, tellurium oxide, aluminum oxide, silicon dioxide, lead oxide, tin oxide, phosphorus oxide, ruthenium oxide, rhodium oxide, iron oxide, copper oxide, manganese dioxide, molybdenum oxide, niobium oxide, titanium oxide, tungsten oxide, bismuth oxide, zirconium oxide, lithium oxide, antimony oxide, lead borate glass, tin phosphate glass, vanadate glass, borosilicate glass, or the like. The glass frit preferably contains at least one kind of transition metal to absorb infrared light.

Moreover, as the above-described glass frits, for example, a frit paste is applied to a substrate and is subjected to heat treatment, laser irradiation, or the like. The frit paste contains the above glass frit and a resin (also referred to as a binder) diluted by an organic solvent. Moreover, glass frit to which an absorber that absorbs light having the wavelength of laser light is added may be used. Moreover, for example, an Nd:YAG laser or a semiconductor laser is preferably used as the laser. Moreover, the irradiation shape of the laser in the laser irradiation may be circular or quadrangular.

Moreover, as the above-described material containing a resin, for example, polyester, polyolefin, polyamide (nylon, aramid, or the like), polyimide, polycarbonate, or an acrylic resin, polyurethane, or an epoxy resin can be used. Alternatively, a material that contains a resin having a siloxane bond such as silicone can be used.

Note that in the case where the material containing glass is used for one or both of the first sealing region 3007 and the second sealing region 3009, the material containing glass preferably has a thermal expansion coefficient close to that of the substrate 3001. With the above structure, generation of a crack in the material containing glass or the substrate 3001 due to thermal stress can be inhibited.

For example, in the case where the material containing glass is used for the first sealing region 3007 and the material containing a resin is used for the second sealing region 3009, the following advantageous effect can be obtained.

The second sealing region 3009 is provided closer to an outer portion of the light-emitting device 3000 than the first sealing region 3007 is. In the light-emitting device 3000, distortion due to external force or the like increases toward the outer portion. Thus, the outer portion side of the light-emitting device 3000 where distortion is increased, that is, the second sealing region 3009 is sealed using the material containing a resin and the first sealing region 3007 provided on an inner side of the second sealing region 3009 is sealed using the material containing glass, whereby the light-emitting device 3000 is less likely to be damaged even when distortion due to external force or the like is generated.

Moreover, as shown in FIG. 10(B), a first region 3011 is formed in the region surrounded by the substrate 3001, the substrate 3003, the first sealing region 3007, and the second sealing region 3009. Moreover, a second region 3013 is formed in the region surrounded by the substrate 3001, the substrate 3003, the light-emitting element 3005, and the first sealing region 3007.

The first region 3011 and the second region 3013 are preferably filled with, for example, an inert gas such as a rare gas or a nitrogen gas. Alternatively, the first region 3011 and the second region 3013 are preferably filled with a resin such as an acrylic, epoxy, or the like. Note that for the first region 3011 and the second region 3013, a reduced pressure state is preferred to an atmospheric pressure state.

Figure 10C:
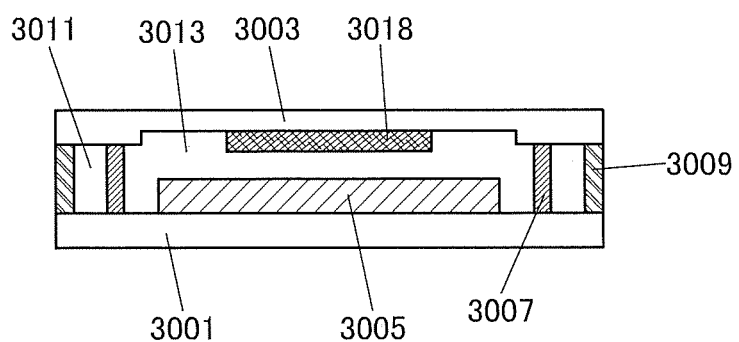

Moreover, FIG. 10(C) shows a modification example of the structure shown in FIG. 10(B). FIG. 10(C) is a cross-sectional view showing the modification example of the light-emitting device 3000.

FIG. 10(C) is a structure in which a recessed portion is provided in part of the substrate 3003 and a desiccant 3018 is provided in the recessed portion. The other structure is the same as the structure shown in FIG. 10(B).

As the desiccant 3018, a substance which adsorbs moisture and the like by chemical adsorption or a substance which adsorbs moisture and the like by physical adsorption can be used.

For example, as the substance that can be used as the desiccant 3018, alkali metal oxides, alkaline earth metal oxides (calcium oxide, barium oxide, and the like), sulfate, metal halides, perchlorate, zeolite, silica gel, and the like are given.

The structure described in this embodiment can be used in combination with the structures described in the other embodiments as appropriate.

Example

In this example, examples where organic compounds were purified by the purification method of one embodiment of the present invention are described.

For the structure of a purification apparatus used in this example, refer to FIG. 2(B); for the structure of a purification tube, refer to FIG. 5(A). Moreover, the structures and abbreviations of compounds used are shown below. Note that the tube outside diameter of a purification portion of the purification apparatus used in this example is 10 mm, the tube outside diameter of a middle portion of the purification tube is 80 mm, and the thickness is 4 mm.

[Chemical formula 1]

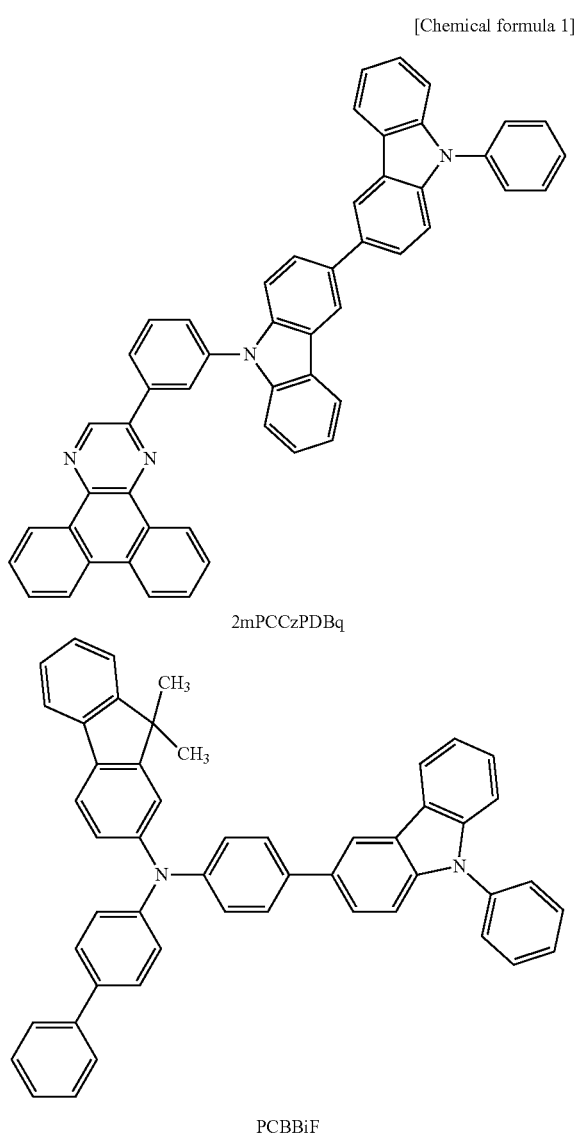

2mPCCzPDBq

PCBBiF

<Purification Example 1 of Compound>

As a sample, 30 g of a yellow solid including 2-{3-[3-(N-phenyl-9H-carbazol-3-yl)-9H-carbazol-9yl]phenyl}dibenzo[f,h]quinoxaline (abbreviation 2mPCCzPDBq) was used. A boat in which the sample was put was placed in the purification portion of the purification apparatus, and the pressure in the purification portion was reduced with a turbo molecular pump used as a gas exhaust means. Moreover, argon was used as a gas supplied into the purification portion. As conditions for the purification, argon was supplied into the purification portion with a flow rate of 15 mL/min so that the pressure in the purification portion became 3.4 Pa, and the sample was subjected to a temperature rise to 380° C. with a temperature adjustment means and heated at the same temperature for 11 hours. After visual confirmation that purified 2mPCCzPDBq condensed as a liquid in the purification portion and there was almost no sample in the boat, a valve of a gas discharge device was closed and argon was supplied into the purification portion, thereby making the pressure inside the purification portion become the atmospheric pressure (approximately $1.0 \times 10^5$ Pa), and the turbo molecular pump was then stopped. After that, the purification portion was allowed to cool to solidify 2mPCCzPDBq, so that 20 g of purified 2mPCCzPDBq was obtained at a collection rate of 67%. The 2mPCCzPDBq solid was collected from the purification tube without being crushed and scattered even after the purification portion was cooled.

<Purification Example 2 of Compound>

As a sample, 35.3 g of a solid including N-(1,1'-biphenyl-4-yl)-N-[4-(9-phenyl-9H-carbazol-3-yl)phenyl]-9,9-dimethyl-9H-fluor en-2-amine (abbreviation: PCBBiF) was used. A boat in which the sample was put was placed in the purification portion of the purification apparatus, and the pressure in the purification portion was reduced with a turbo molecular pump used as the gas exhaust means. Moreover, argon was used as a gas supplied into the purification portion. As conditions for the purification, argon was supplied into the purification portion with a flow rate of 15 mL/min so that the pressure in the purification portion became 3.4 Pa, and the sample was subjected to a temperature rise to 125° C. over 20 minutes with a temperature adjustment means and kept at the same temperature for 30 minutes. After that, the sample was subjected to a temperature rise to 240° C. over 40 minutes and kept at the same temperature for 30 minutes. Next, the sample was subjected to a temperature rise to 270° C. over 2 hours and kept at the same temperature for 30 minutes. Furthermore, the sample was subjected to a temperature rise to 345° C. over 30 minutes and heated at the same temperature for 11 hours. After visual confirmation that purified PCBBiF condensed as a liquid in the purification portion and there was almost no sample in the boat, the temperature was decreased to 280° C. over 1 hour. After that, a valve of a gas discharge device was closed and argon was supplied into the purification portion, thereby making the pressure inside the purification portion become the atmospheric pressure (approximately $1.0 \times 10^5$ Pa), and the turbo molecular pump was then stopped. After that, the purification portion was allowed to cool to solidify PCBBiF, so that 26.7 g of the purified PCBBiF solid was obtained at a collection rate of 76%. The PCBBiF solid was collected from the purification tube without being crushed and scattered even after the purification portion was cooled.

Moreover, purity measurement by LC/MS analysis revealed that 26.7 g of collected PCBBiF has a purity of 99.9%, which is a high purity. Moreover, as an impurity at 0.1%, a substance predicted to result from detachment of a methyl group from PCBBiF was detected. Note that in the LC/MS analysis used for the purity measurement, LC (liquid chromatography) separation was carried out with Acquity UPLC manufactured by Waters Corporation, and MS analysis (mass spectrometry) was carried out with Xevo G2 Tof MS manufactured by Waters Corporation. Acquity UPLC BEH C8 (2.1×100 mm, 1.7 µm) was used as a column for the LC separation.

<Purification Example 3 of Compound>

As a comparison with the above Purification example 2, a purification example where, after purification, the purification portion is cooled without making the pressure of the purification portion have the atmospheric pressure is described.

As in Purification example 2, 35.2 g of a solid containing PCBBiF was used as a sample. A boat in which the sample was put was placed in the purification portion of the purification apparatus, and the pressure in the purification portion was reduced with a turbo molecular pump used as a gas exhaust means. Moreover, argon was used as a gas supplied into the purification portion. As conditions for the purification, argon was supplied into the purification portion with a flow rate of 15 mL/min so that the pressure in the purification portion became 3.4 Pa, and the sample was subjected to a temperature rise to 125° C. over 20 minutes with a temperature adjustment means and kept at the same temperature for 30 minutes. After that, the sample was subjected to a temperature rise to 240° C. over 40 minutes and kept at the same temperature for 30 minutes. Next, the sample was subjected to a temperature rise to 270° C. over 2 hours and kept at the same temperature for 30 minutes. Furthermore, the sample was subjected to a temperature rise to 345° C. over 30 minutes and heated at the same temperature for 11 hours. After visual confirmation that purified PCBBiF condensed as a liquid in the purification portion and there was almost no sample in the boat, the temperature was decreased to 280° C. over 1 hour.

After that, the purification portion was allowed to cool while keeping the pressure in the purification portion at the pressure set during purification, whereby PCBBiF solidified and 23.6 g of the purified PCBBiF solid was obtained at a collection rate of 67%.

Note that there occurred a phenomenon in which, during the cooling of the purification portion, purified PCBBiF was crushed and scattered in the purification portion. The scattered PCBBiF solid weighed 2.5 g.

The above-described results show that the use of the purification method of one embodiment of the present invention allows purification without crush and scattering of the intended substance. Moreover, it is found that the intended substance can be obtained with a high purity at a high collection rate.

DESCRIPTION OF NUMERALS 100 purification apparatus
100a purification apparatus
100b purification apparatus
110 purification portion
120 temperature adjustment means
150 gas supply means
160 gas discharge means
180a purification tube
180b purification tube
180c purification tube
200 sample
210 substance
212 end portion
221 middle portion
222 middle portion
231 end portion
232 end portion
280 pressure gauge
290 cooling trap
300 organic semiconductor element
301 source electrode
302 drain electrode
303 gate electrode
330 active layer
400 EL layer
401 electrode
402 electrode
406 light-emitting unit
408 light-emitting unit
411 hole-injection layer
412 hole-transport layer
413 electron-transport layer
414 electron-injection layer
415 charge-generation layer
416 hole-injection layer
417 hole-transport layer
418 electron-transport layer
419 electron-injection layer
420 light-emitting layer
430 light-emitting layer
431 guest material
432 host material
440 light-emitting layer
450 light-emitting element
452 light-emitting element
600 display device
601 signal line driver circuit portion
602 pixel portion
603 scan line driver circuit portion
604 sealing substrate
605 sealing material
607 region
608 wiring
609 FPC
610 element substrate
611 transistor
612 transistor
613 lower electrode
614 partition wall
616 EL layer
617 upper electrode
618 light-emitting element
621 optical element
622 light-blocking layer
623 transistor
624 transistor
3000 light-emitting device
3001 substrate
3003 substrate
3005 light-emitting element
3007 sealing region
3009 sealing region
3011 region
3013 region
3018 desiccant
8000 display module
8001 upper cover
8002 lower cover
8003 FPC
8004 touch sensor
8005 FPC
8006 display device
8009 frame
8010 printed board
8011 battery

The invention claimed is:

1. A purification apparatus comprising:
a purification portion where a substance is purified by vaporization;
a temperature adjustment means provided in the purification portion;
a gas supply means provided at one end portion of the purification portion, the gas supply means being configured to supply a gas into the purification portion;
a gas discharge means provided at the other end portion of the purification portion, the gas discharge means being configured to discharge a gas from the purification portion; and
a control system, wherein the control system is configured to control the gas supply means, the gas discharge means, and the temperature adjustment means, wherein the control system is configured to control the gas discharge means so that a pressure in the purification portion becomes a first pressure, wherein the control system is configured to control the temperature adjustment so that a temperature gradient is generated in the purification portion, wherein the control system is configured to control the gas supply means so that in a pressure in the purification portion becomes a second pressure after the substance is purified, wherein the control system is configured to control the temperature adjustment so that the purification portion is cooled, wherein the second pressure is higher than the first pressure, and wherein the second pressure is higher than or equal to an atmospheric pressure.

2. The purification apparatus according to claim 1, wherein the first pressure is lower than or equal to 10 Pa.

3. The purification apparatus according to claim 2, wherein the first pressure is higher than or equal to 0.1 Pa.

4. The purification apparatus according to claim 1, wherein the temperature adjustment means is configured to heat the purification portion so that a temperature of part of an inside of the purification portion becomes higher than or equal to 150° C. and lower than or equal to 500° C.

5. The purification apparatus according to claim 1, wherein the gas discharge means is configured to discharge the gas from the purification portion to provide the first pressure.

6. The purification apparatus according to claim 1, wherein the gas supply means is configured to supply the gas to the purification portion to provide the second pressure.

* * * * *

UNITED STATES PATENT AND TRADEMARK OFFICE
CERTIFICATE OF CORRECTION

PATENT NO.         : 11,090,577 B2
APPLICATION NO.    : 16/090914
DATED              : August 17, 2021
INVENTOR(S)        : Sachiko Kawakami, Yasushi Kitano and Kanta Abe It is certified that error appears in the above-identified patent and that said Letters Patent is hereby corrected as shown below:

On the Title Page

Item (72) Inventors:
Change "Kanata," to --Kanta--.

Signed and Sealed this
Fourth Day of January, 2022

Drew Hirshfeld
*Performing the Functions and Duties of the*
*Under Secretary of Commerce for Intellectual Property and*
*Director of the United States Patent and Trademark Office*